(12) United States Patent
Wang et al.

(10) Patent No.: US 11,816,487 B2
(45) Date of Patent: Nov. 14, 2023

(54) METHOD OF CONVERTING EXTENDED INSTRUCTIONS BASED ON AN EMULATION FLAG AND RETIREMENT OF CORRESPONDING MICROINSTRUCTIONS, DEVICE AND SYSTEM USING THE SAME

(71) Applicant: Shanghai Zhaoxin Semiconductor Co., Ltd., Shanghai (CN)

(72) Inventors: Weilin Wang, Beijing (CN); Yingbing Guan, Shanghai (CN); Mengchen Yang, Beijing (CN)

(73) Assignee: Shanghai Zhaoxin Semiconductor Co., Ltd., Shanghai (CN)

( * ) Notice: Subject to any disclaimer, the term of this patent is extended or adjusted under 35 U.S.C. 154(b) by 0 days.

(21) Appl. No.: 17/471,170

(22) Filed: Sep. 10, 2021

(65) Prior Publication Data
US 2022/0206807 A1 Jun. 30, 2022

(30) Foreign Application Priority Data

Dec. 29, 2020 (CN) .......................... 202011588885.3
Dec. 29, 2020 (CN) .......................... 202011588921.6

(51) Int. Cl.
*G06F 9/30* (2018.01)
*G06F 9/38* (2018.01)
(Continued)

(52) U.S. Cl.
CPC ........ *G06F 9/30145* (2013.01); *G06F 9/3017* (2013.01); *G06F 9/30047* (2013.01);
(Continued)

(58) Field of Classification Search
CPC ............. G06F 9/30145; G06F 9/30047; G06F 9/30101; G06F 9/3017; G06F 9/30174;
(Continued)

(56) References Cited

U.S. PATENT DOCUMENTS

| 4,839,797 A * | 6/1989 | Katori ................. G06F 9/30174 712/210 |
| 4,873,629 A | 10/1989 | Harris et al. |

(Continued)

OTHER PUBLICATIONS

"Notice of allowance of Related U.S. Appl. No. 17/471,400", dated Oct. 19, 2022, pp. 1-21.

(Continued)

*Primary Examiner* — Shawn Doman
(74) *Attorney, Agent, or Firm* — JCIPRNET

(57) ABSTRACT

An instruction conversion device, an instruction conversion method, an instruction conversion system, and a processor are provided. The instruction conversion device includes a monitor for determining whether a ready-for-execution instruction is an instruction that belongs to a new instruction set or an extended instruction set, wherein the new instruction set and the extended instruction set have the same type of the instruction set architecture as that of the processor. If the ready-for-execution instruction is determined as an extended instruction, this extended instruction is converted into a converted instruction sequence by means of the conversion system, this converted instruction sequence is then sent to the processor for executions, thereby extending the lifespans of the electronic devices embodied with old-version processors.

27 Claims, 16 Drawing Sheets

(51) Int. Cl.
*G06F 9/48* (2006.01)
*G06F 11/07* (2006.01)
*G06F 9/455* (2018.01)

(52) U.S. Cl.
CPC ...... *G06F 9/30101* (2013.01); *G06F 9/30174* (2013.01); *G06F 9/30185* (2013.01); *G06F 9/30189* (2013.01); *G06F 9/3814* (2013.01); *G06F 9/3857* (2013.01); *G06F 9/455* (2013.01); *G06F 9/45516* (2013.01); *G06F 9/4812* (2013.01); *G06F 11/0772* (2013.01)

(58) Field of Classification Search
CPC ............. G06F 9/30185; G06F 9/30189; G06F 9/3814; G06F 9/3857; G06F 9/455; G06F 9/45516; G06F 9/4812; G06F 11/0772; G06F 30/00
See application file for complete search history.

(56) References Cited

U.S. PATENT DOCUMENTS

| | | | |
|---|---|---|---|
| 5,630,052 A | 5/1997 | Shah | |
| 5,701,442 A | 12/1997 | Ronen | |
| 5,781,750 A | 7/1998 | Blomgren et al. | |
| 5,794,063 A | 8/1998 | Favor | |
| 5,838,987 A | 11/1998 | Brightman et al. | |
| 5,881,258 A | 3/1999 | Arya | |
| 5,896,519 A * | 4/1999 | Worrell | G06F 9/30181 712/213 |
| 5,909,567 A | 6/1999 | Novak et al. | |
| 5,983,337 A * | 11/1999 | Mahalingaiah | G06F 9/3017 712/226 |
| 6,093,213 A | 7/2000 | Favor et al. | |
| 6,496,922 B1 * | 12/2002 | Borrill | G06F 9/30189 712/210 |
| 6,711,667 B1 * | 3/2004 | Ireton | G06F 9/30174 712/E9.067 |
| 6,928,536 B2 | 8/2005 | Duesterwald et al. | |
| 7,831,807 B1 * | 11/2010 | Johnson | G06F 9/328 712/211 |
| 9,442,794 B1 | 9/2016 | Tian | |
| 9,563,424 B2 | 2/2017 | Sehr et al. | |
| 9,594,927 B2 | 3/2017 | Zimmer et al. | |
| 2001/0010072 A1 | 7/2001 | Yoshida | |
| 2003/0221035 A1 | 11/2003 | Adams | |
| 2004/0111717 A1 | 6/2004 | Abdulhayoglu | |
| 2008/0216073 A1 | 9/2008 | Yates et al. | |
| 2008/0282241 A1 | 11/2008 | Dong | |
| 2009/0158015 A1 | 6/2009 | Hillman et al. | |
| 2009/0204785 A1 | 8/2009 | Yates, Jr. et al. | |
| 2009/0222654 A1 | 9/2009 | Hum et al. | |
| 2010/0058034 A1 | 3/2010 | Zaks | |
| 2010/0192137 A1 * | 7/2010 | Inglis | G06F 9/45516 717/136 |
| 2011/0093627 A1 | 4/2011 | De et al. | |
| 2012/0260042 A1 | 10/2012 | Henry et al. | |
| 2013/0246768 A1 | 9/2013 | Gschwind | |
| 2013/0305013 A1 * | 11/2013 | Ebersole | G06F 9/30174 712/32 |
| 2014/0129808 A1 | 5/2014 | Naveh et al. | |
| 2014/0281399 A1 | 9/2014 | Rash et al. | |
| 2014/0304493 A1 | 10/2014 | Zhong et al. | |
| 2015/0356297 A1 | 12/2015 | Guri et al. | |
| 2016/0026482 A1 * | 1/2016 | Abdallah | G06F 8/44 703/26 |
| 2016/0026486 A1 | 1/2016 | Abdallah | |
| 2016/0070932 A1 | 3/2016 | Zimmer et al. | |
| 2016/0092236 A1 * | 3/2016 | Kanapathipillai | G06F 9/3857 712/216 |
| 2017/0134347 A1 | 5/2017 | Kupreev et al. | |
| 2018/0159747 A1 | 6/2018 | Chang et al. | |
| 2018/0322313 A1 | 11/2018 | Yao et al. | |
| 2019/0034316 A1 | 1/2019 | Levit-Gurevich et al. | |
| 2019/0043159 A1 * | 2/2019 | Levit-Gurevich | G06F 9/455 |
| 2019/0220279 A1 | 7/2019 | McNeeney et al. | |
| 2019/0391904 A1 | 12/2019 | Sabharwal et al. | |
| 2020/0073643 A1 | 3/2020 | Tsirkin | |
| 2020/0082491 A1 | 3/2020 | Harris | |
| 2021/0117251 A1 | 4/2021 | Cristofi et al. | |
| 2021/0182724 A1 | 6/2021 | Zou et al. | |
| 2021/0397425 A1 * | 12/2021 | Zwarich | G06F 12/1009 |
| 2022/0066933 A1 | 3/2022 | Kamand | |
| 2022/0100527 A1 | 3/2022 | Viste et al. | |
| 2022/0197678 A1 * | 6/2022 | Poornachandran | G06F 9/3802 |
| 2022/0206794 A1 | 6/2022 | Wang et al. | |
| 2022/0206808 A1 | 6/2022 | Wang et al. | |
| 2022/0206810 A1 | 6/2022 | Wang et al. | |
| 2022/0206812 A1 | 6/2022 | Wang et al. | |
| 2022/0206813 A1 | 6/2022 | Wang et al. | |
| 2022/0206815 A1 | 6/2022 | Wang et al. | |
| 2023/0221957 A1 | 7/2023 | Pool et al. | |

OTHER PUBLICATIONS

"Office Action of Related U.S. Appl. No. 17/471,423", dated Oct. 5, 2022, pp. 1-20.
"Office Action of Related U.S. Appl. No. 17/471,440", dated Sep. 21, 2022, p. 1-p. 12.
"Office Action of Related U.S. Appl. No. 17/471,167", dated Oct. 31, 2022, pp. 1-23.
"Office Action of Related U.S. Appl. No. 17/471,343", dated Jun. 27, 2022, p. 1-p. 9.
"Notice of allowance of Related U.S. Appl. No. 17/471,387", dated Jul. 11, 2022, p. 1-p. 9.
"Office Action of Related U.S. Appl. No. 17/471,371", dated Jan. 26, 2023, p. 1-p. 46.
"Office Action of Related U.S. Appl. No. 17/471,454", dated Jan. 19, 2023, p. 1-p. 46.
"Office Action of Related U.S. Appl. No. 17/471,359", dated Dec. 21, 2022, pp. 1-29.
"Office Action of Related U.S. Appl. No. 17/471,423", dated Apr. 13, 2023, p. 1-p. 10.
"Office Action of Related U.S. Appl. No. 17/471,454", dated Apr. 18, 2023, p. 1-p. 24.
"Notice of allowance of Related U.S. Appl. No. 17/471,454", dated Jun. 22, 2023, p. 1-p. 17.
"Office Action of U.S. Related Application, U.S. Appl. No. 17/471,371", dated Jul. 18, 2023, p. 1-p. 13.
"Notice of allowance of U.S. Related Application, U.S. Appl. No. 17/471,423", dated Jul. 25, 2023, p. 1-p. 17.

* cited by examiner

METHOD OF CONVERTING EXTENDED INSTRUCTIONS BASED ON AN EMULATION FLAG AND RETIREMENT OF CORRESPONDING MICROINSTRUCTIONS, DEVICE AND SYSTEM USING THE SAME

CROSS-REFERENCE TO RELATED APPLICATION

This application claims the priority benefit of China application serial no. 202011588885.3, filed on Dec. 29, 2020, and China application serial no. 202011588921.6, filed on Dec. 29, 2020. The entirety of each of the above-mentioned patent applications is hereby incorporated by reference herein and made a part of the specification.

BACKGROUND

Technical Column

The disclosure relates to a technology for implementing the compatibility of computer instructions, and particularly relates to an instruction conversion device, an instruction conversion method, an instruction conversion system, and a processor.

Description of Related Art

With the continuous developments in computer systems, processor manufacturers may upgrade their instruction sets of those instruction set architectures (ISAs) supported by their processors. A processor may not support an instruction under a new, or an extended instruction set sharing the same ISA currently supported by itself, such that the instruction may be executed inaccurately and thus cause executional errors, which may confuse users.

Therefore, an old-version processor and/or the computer system embodied with it may be thrown away if this old-version is unable to support an instruction under a new, or an extended instruction set, which is obvious a resource-wasting as well as a life-shortening approach for the uses of those electronic appliances embodied with old-version processors therein.

SUMMARY

The disclosure provides an instruction conversion device and an instruction conversion method adapted to convert an extended instruction that belongs to a new instruction set or an extended instruction set relative to the old-version processor into a converted instruction sequence that may be correctly executed by the old-version processor, wherein the new instruction set and the extended instruction set have the same type of the instruction set as that of an old-version processor. Moreover, after the old-version processor executes the converted instruction sequence, it may correctly simulate the function indicated by the extended instruction, thereby extending the lifespan of the electronic device embodied with the old-version processor therein.

The instruction conversion device of the disclosure includes a monitor. The monitor is adapted to determine whether the ready-for-execution instruction is a supported instruction or an extended instruction. If the ready-for-execution instruction is a supported instruction, the ready-for-execution instruction is executed by a processor. If the ready-for-execution instruction is an extended instruction, the ready-for-execution instruction is converted into a converted instruction sequence through a conversion system, and the converted instruction sequence is sent to the processor for executions.

The instruction conversion method of the disclosure includes the following steps. A ready-for-execution instruction is determined as a supported instruction or an extended instruction. If the ready-for-execution instruction is a supported instruction, this ready-for-execution instruction is executed by a processor; and if the ready-for-execution instruction is an extended instruction, this ready-for-execution instruction is converted into a converted instruction sequence through the conversion system and sent to the processor for executions.

Based on the above, the instruction conversion device and the instruction conversion method in the embodiments of the disclosure use a monitor to determine whether the ready-for-execution instruction derived from the application program is a supported instruction of the processor or an extended instruction for the processor. Additionally, when the ready-for-execution instruction is determined an extended instruction, a conversion system converts the ready-for-execution instruction into a converted instruction sequence that may be executed by the processor, and this converted instruction sequence is sent to the processor for executions.

In the embodiments of the disclosure, the converted instruction sequence corresponding to the extended instruction may also be stored in a conversion cache. When another ready-for-execution instruction is determined as the extended instruction that has been converted, corresponding converted instruction sequence stored in the conversion cache may be provided to the processor pipeline circuitry for executions, which prevents repetitive conversions performed by the conversion system. Therefore, the old-version processor adopting the embodiments of the disclosure may convert an extended instruction through the conversion system and execute associated converted instruction sequence, thereby extending the lifespan of the electronic device.

DESCRIPTION OF THE EMBODIMENTS

Figure 1:
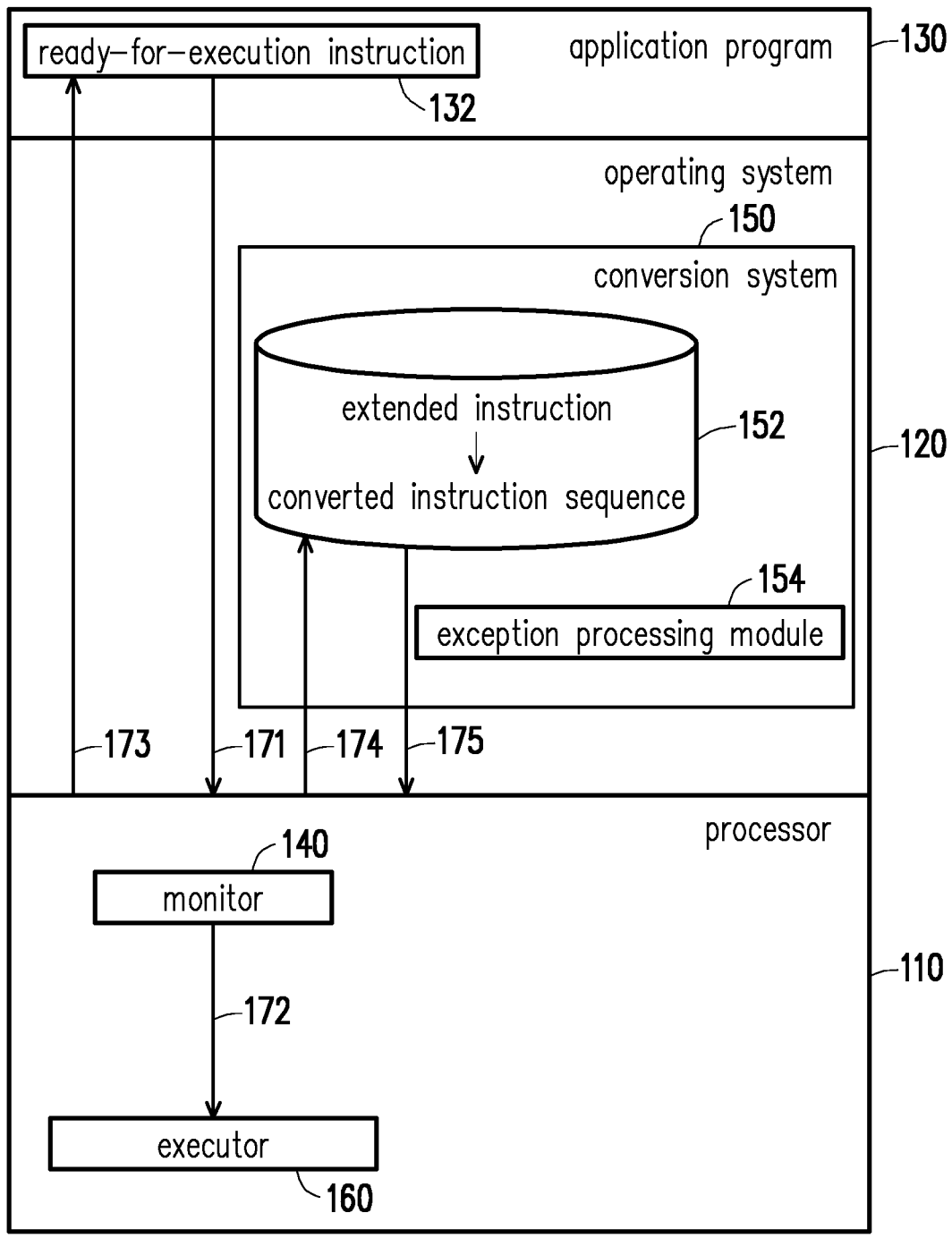
FIG. 1 is a schematic view of an electronic device embodied with a conversion device according to a first embodiment of the disclosure.

Some terminologies and technical terms herein are used to describe embodiments of the specification only and should not be constructed as any limitation to the present invention:

A supported instruction: a native instruction of a certain series/model of processors or an instruction that may be recognized/interpreted as at least one native instructions, and therefore may be implemented accurately by the processors.

An unsupported instruction: an unsupported instruction refers to at least one of the three types of instructions: (a). an instruction which is under a new/extension instruction set in comparison with that of a certain series/model of a processor but shares the same ISA with that of this processor such that such an instruction may be inaccurately recognized/interpreted by the processor, (b). an incorrect/invalid instruction, or (c). an instruction that is classified as a different ISA from that of the processor.

An extended instruction: an extended instruction is an instruction under a new/extended instruction set in comparison with that of a certain series/model of processor but shares the same ISA as that of this processor, such that an extended instruction may be inaccurately recognized/interpreted by the processor and may raise an incompatible issue. For example, an instruction in AVX/AVX-512 (for example, VADDSD or VADDPD) is an extended instruction for a Pentium M processor. An extended instruction is also the type (a) of the unsupported instruction aforementioned.

An unconvertible instruction: an unconvertible instruction refers to one of the two types of instructions: (a). an incorrect/invalid instruction of the aforementioned unsupported instruction or (b). an instruction that shares a different ISA from that of the processor (for example, any instruction in an ARM/RISC ISA is an instruction sharing different ISA from that of a X86 processor). An unconvertible instruction may be type (b) or (c) of the aforementioned unsupported instruction.

A converted instruction sequence: a converted instruction sequence is an instruction sequence that is programed by means of the native instructions or the supported instructions of the processor in advance according to the operation indicated by the extended instruction. An execution result of the converted instruction sequence is the same as that of an associated extended instruction.

It is to be noted that the supported instruction, the unsupported instruction, the extended instruction, the unconvertible instructions, the converted instruction sequence, etc. are all related to a certain series or model of processors. Specifically, the processors may be, but not limit to, those Reduced Instruction Set Computing (RISC) processors supporting an ARM Cortex series instruction sets, Complex Instruction Set Computing (CISC) processors supporting X86 instruction set developed by Intel/AMD, Microprocessor without Interlocked Pipeline Stages (MIPS) processors, processors supporting RISC-five (RISC-V) instruction set architecture, processors supporting both the ARM and X86, or processors equipped with an ISA other than RISC/CISC. The disclosure does not specifically limit any ISA type supported by the processor. Those skilled in the art should understand that an integrated circuit manufacturer may define/implement their own microarchitectures under the ISA supported by their processors according to their requirements, and the disclosure is not limited thereto.

Regarding those terminologies defined above, those skilled in the art may define different technical terms with respect to the technical ideas of the disclosure by themselves. Those terminologies defined aforementioned should be understood from the perspectives of technical-function implementations and should not be distinguished by the wording thereof. The disclosure is not limited thereto. Those skilled in the art should understand that integrated circuit manufacturers may use different terms to define a specific concept and/or refer to a specific component. The specification and claims do not distinguish a technical term by means of the difference in wording only, but distinguish it based on the difference in its technical-function. The terms "including" and "comprising" mentioned in the entire specification and claims are open-ended terms, so they should be interpreted as "including but not limited to". In addition, the term "couple" used in this specification (including claims) may refer to any direct or indirect electrical connection approaches. For example, "a first device is coupled to a second device" should be interpreted as "the first device is directly electrically connected to the second device" or "the first device is indirectly electrically connected to the second device over other devices or connection manners." Those skilled in the art should know that those variations described above do not depart from the spirits of the disclosure and should be included in the appended claims.

In the embodiments of the disclosure, the instructions executed in the processor refer to machine instructions (or machine codes) generated after the programs, which are written in middle/high-level programming languages (e.g., C /C++/C#, Java, or Python . . . etc.) by programmers and then processed by a compiler or an interpreter. Those skilled in the art should understand that, for the sake of illustration and convenience of descriptions, the instructions executed by the processor refer to the machine instructions generated by the compiler or the interpreter in the embodiments of the disclosure, so no further explanation of the difference is illustrated subsequently.

As previously mentioned, when a ready-for-execution instruction is an instruction under a new instruction set or under an extended instruction set, the processor may not decode it correctly, so a no operation instruction or a no operation performed (NOP) instruction is generated and an undefined instruction exception occurs. Moreover, when the no operation instruction corresponding to the extended instruction is retired, an exception service program corresponding to the undefined instruction exception is called to handle the exception and then reports the undefined instruction exception to the operating system and the application program. The inventor of the disclosure takes advantage of the feature, by sending a conversion request to the conversion system instead of calling the interrupt service program corresponding to the undefined instruction exception when the no operation instruction corresponding to the extended instruction is retired. A converted instruction sequence (as mentioned above, the converted instruction sequence is programed by means of the native instruction or the supported instruction of the processor in advance) corresponding to the extended instruction is obtained thereafter, so that the purpose of simulating the execution result of the extended instruction is achieved. The embodiments of the disclosure accompanied with drawings and corresponding descriptions are illustrated in detail below.

FIG. 1 is a schematic view of an electronic device 100 embodied with a conversion device according to the first embodiment of the disclosure. The electronic device 100, for example, is a consumer electronic device, such as a tablet computer, a smart phone, a computer, or a server, etc. The electronic device 100 in FIG. 1 includes a processor 110, configured to perform an operating system (OS) 120 and application programs 130 thereon. When the electronic device 100 is turned on, a basic input/output system (BIOS) performs self-testing and initialization, while the operating system 120 is subsequently performed by means of the processor 110. The operating system 120 running on the processor 110 manages the execution of each of the application programs 130. The application program 130 includes multiple ready-for-execution instructions 132, which are executed by the processor 110 to implement the functions defined by the application program 130. Specifically, the processor 110 reads the ready-for-execution instruction 132 derived from the application program 130 from a storage medium (e.g., a hard disk, not shown) into a dynamic random access memory (not shown), and then executes the ready-for-execution instruction 132 in program order. As mentioned above, the instructions 132 executed by the processor 110 are machine instructions generated by a compiler or an interpreter rather than a source code written by a programmer.

When the processor 110 executes a ready-for-execution instruction 132 derived from the operating system 120 or the application program 130, a monitor 140 determines whether the ready-for-execution instruction 132 (along the arrow 171 shown in FIG. 1) is a supported instruction or an unsupported instruction. If the monitor 140 determines that the ready-for-execution instruction 132 is a supported instruction, the ready-for-execution instruction 132 is executed by the processor 110 (e.g., it is sent to an executor 160 along the arrow 172 for executions), and an execution result is returned to the application program 130 (along the arrow 173 shown in FIG. 1). The execution process of the supported instructions is well-known to those skilled in the art, which is not described in detail in the specification. In addition, if the monitor 140 determines that the ready-for-execution instruction 132 is a unconvertible instruction, the processor 110 issues an illegal/undefined instruction exception and then calls a corresponding exception service program according to the undefined instruction interrupt vector (e.g. #UD). An error or an execution exception is finally reported to the operating system 120 and the application program 130 (along the arrow 173 shown in FIG. 1). Regarding how to process the unconvertible instruction, it is known to those skilled in the art, which is not described in detail herein. Furthermore, if the monitor 140 determines that the ready-for-execution instruction 132 is an extended instruction, the extended instruction is sent to a conversion system 150 (along the arrow 174). After obtaining the corresponding converted instruction sequence (which is programed by means of at least one native instruction as mentioned) through searching the extended instruction in an extended instruction database 152 (which includes multiple converted instruction sequences corresponding to the extended instructions), the obtained converted instruction sequence is returned to the processor 110 for executions (along the arrow 175). In the following paragraphs, FIG. 3A to FIG. 3C and FIG. 4A to FIG. 4C are used to specifically illustrate an operation in which the monitor 140 determines whether the ready-for-execution instruction 132 is an extended instruction, and the conversion system 150 converts the extended instruction to obtain the converted instruction sequence when the ready-for-execution instruction 132 is determined an extended instruction. In another embodiment, if the monitor 140 determines that the ready-for-execution instruction 132 is an extended instruction, the entire extended instruction, such as format information, operands, etc., is sent to the conversion system 150 for conversions. In another embodiment, only the format information of the extended instruction may be sent to the conversion system 150, but the disclosure is not limited thereto.

For the sake of descriptions, the x86 instruction set architecture is used for description in the embodiment of the disclosure, but the disclosure is not limited to the x86 instruction set architecture. It can be seen from the above descriptions that the processor 110 equipped with the x86 instruction set may be unable to support a new/extended x86 instruction set as well as any extended instruction in the new/extended one, such that the processor 110 may inaccurately recognize and execute the extended instruction with its existing x86 instruction set although the extended instruction is under the x86 instruction set. Therefore, in the embodiment of the disclosure, when the monitor 140 determines that the ready-for-execution instruction 132 is an extended instruction under the new/extended x86 instruction set, the conversion system 150 converts the ready-for-execution instruction 132 into a converted instruction sequence and then this converted instruction sequence is provided to the processor 110 equipped with the x86 instruction set. The executor 160 inside the processor 110 executes the converted instruction sequence provided by the conversion system 150 (in some embodiments, the native instructions that constitute the converted instruction sequence are compiled and then executed; in another embodiment, the converted instruction sequence is executed directly without being compiled), so that a simulation execution result corresponding to the ready-for-execution instruction 132 is obtained. Therefore, in the embodiment of the disclosure, the conversion system 150 embodied with the old-version processor converts the extended instruction under the new/extended instruction set into a converted instruction sequence, and then the old-version processor performs the operation indicated by the converted instruction sequence, thereby extending the lifespan of the electronic device.

The processor 110, for example, may be a single-core or multi-core central processing unit (CPU), a micro-processor, other programmable processing units, a digital signal processor (DSP), a programmable controller, an application specific integrated circuit (ASIC), a programmable logic device (PLD), or other similar devices. The disclosure does not limit the architecture and the type of the processor.

In the embodiment of FIG. 1, the monitor 140 is disposed inside the processor 110 and is implemented as a hardware module. However, according to the design needs, those skilled in the art may adopt other circuit structure or corresponding firmware/software programs to implement the function determining whether the ready-for-execution instruction 132 is a supported instruction or an extended instruction. For example, the monitor 140 may be implemented by updating a processor driver. An old-version processor is neither able to decode the instruction under the new instruction set, nor able to call the conversion system 150 to convert the extended instruction into the converted instruction sequence, because the old-version processor does not include a hardware similar to the monitor 140. However, if the function of the monitor 140 is programed into a software program code and becomes a part of the processor driver of the old-version processor, when the old-version processor generates an undefined instruction (e.g. #UD) exception, the conversion system 150 in the operation system 120 is called via a callback function. Moreover, when the conversion system 150 embodied within the processor driver determines that the current instruction is an extended instruction, the conversion system 150 converts the extended instruction and then returns the corresponding converted instruction sequence to the old-version processor for executions. The driver including the conversion system 150 may be updated through live updates. After processor designers program the converted instruction sequence for the extended instruction under the new/extended instruction set by means of the native instructions of the old-version processor, the user of the old-version processor may be notified to update the processor driver through live updates so as to make the old-version processor possess the ability of supporting the new/extended instruction set. Note that any hardware module or software program capable of implementing the determining function should be regarded as a substitute of the monitor 140. In general, any hardware unit and/or software program implementing the function of determining whether the ready-for-execution instruction is a supported instruction or an extended instruction should be regarded as the monitor 140 in the embodiment. The disclosure is not limited thereto.

Figure 7:
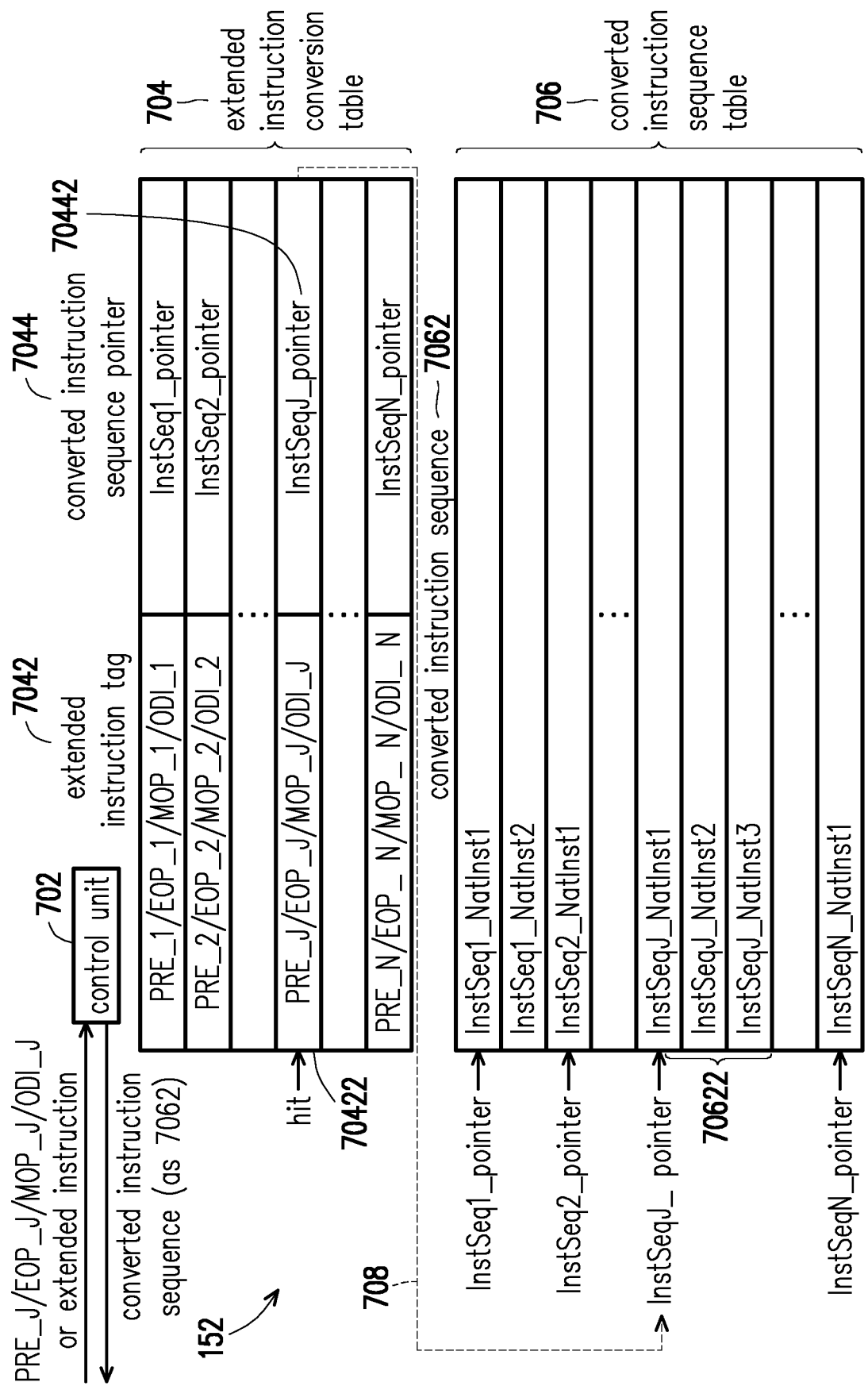
FIG. 7 is a schematic structure of an extended instruction database 152 in FIG. 1.

Next, the operations of the conversion system 150 is illustrated with reference to FIG. 7. FIG. 7 shows an exemplarily schematic structure of the extended instruction database 152 in FIG. 1. The conversion system 150 may include this extended instruction database 152 of FIG. 7 therein. The extended instruction database 152 shown in FIG. 7 includes a control unit 702, an extended instruction conversion table 704, and a converted instruction sequence table 706. The control unit 702 is responsible for the conversions of the extended instruction and returns the corresponding converted instruction sequence to the processor 110, which is illustrated in detail subsequently. The extended instruction conversion table 704 includes two parts: an extended instruction tag 7042 and a converted instruction sequence pointer 7044 respectively used to store the format information of the extended instruction and the storage address of the converted instruction sequence corresponding to the extended instruction in the extended instruction database 152. The converted instruction sequence table 706 stores the converted instruction sequences 7062 of all extended instructions, which are called through the converted instruction sequence pointer 7044.

The control unit 702 compares the format information of the extended instruction, such as a prefix (PRE), an escape code (EOP), an opcode (MOP), and other decode information (ODI, as aforementioned, which includes information within an extended instruction required for instruction decoding/interpretations. In one embodiment, the ODI includes an operand mode (ModR/M)) with the extended instruction tag 7042 stored in the extended instruction conversion table 704. If a match is found (i.e., the format information of the extended instruction hits with one of the extended instruction tags 7042), the control unit 702 traverses the converted instruction sequence table 706 and then accesses the required converted instruction sequence 7062 along the indication of the converted instruction sequence pointer 7044 corresponding to the extended instruction tag 7042. Assume the format information of the ready-for-execution instruction 132 sent from the processor 110 is PRE_J/EOP_J/MOP_J/ODI_J (J is an integer between 1 and N), the control unit 702 compares each extended instruction tag 7042 with the PRE_J/EOP_J/MOP_J/ODI_J. As shown in FIG. 7, the format information PRE_J/EOP_J/MOP_J/ODI_J has been stored in the extended instruction database 152, so a "hit" occurs at the tag indicated by 70422 and the corresponding converted instruction sequence pointer 70442 (that is, InstSeqJ_pointer) may be accessed and then employed to look for the required converted instruction sequence from the converted instruction sequence table 706. The converted instruction sequence 70622 is then found along the indication of a dashed-line arrow 708. As shown in FIG. 7, the converted instruction sequence 70622 is programed by means of three native instructions or supported instructions (that is, InstSeqJ_NatInst1, InstSeqJ_NatInst2, and InstSeqJ_NatInst3) of the processor 110. Finally, the control unit 702 directs the converted instruction sequence 70622 to the processor 110 along the indication of an arrow 175 for decoding, or directly sends it to the executor 160 for executions. In one embodiment, the processor 110 may further send associated context information of the ready-for-execution instructions 132 and the current context of the processor 110 to the conversion system 150 to determine whether the ready-for-execution instruction 132 (that is an extended instruction currently) may be executed in the current context of the processor 110. For example, the control unit 702 may call the corresponding interrupt service program to notify the operating system 120/application program 130 of an abnormality/exception when the extended instruction is determined incapable of being executed (or is unsuitable to be executed) in the current context of the processor 110 (e.g., the extended instruction needs to be run in a protected mode, while currently the processor is in a real mode). In one embodiment, the processor 110 only sends a part of the extended instruction, such as PRE/EOP/MOP to the conversion system 150 for comparing, and then the conversion system 150 returns the corresponding converted instruction sequence to the processor 110. Because the emulation flag EF has been asserted (indicating that the processor 110 is currently converting the extended instruction through the conversion system 150), after the processor 110 obtains the converted instruction sequence and then integrates the converted instruction sequence with the operands of the ready-for-execution instruction 132 (the extended instruction currently) previously stored in a private registers 340, the converted instruction sequence that has been combined is subsequently sent to a pipeline circuitry (e.g., the executor 160) for executions. In yet another embodiment, when all the information of the ready-for-execution instruction 132 is sent to the conversion system 150, the control unit 702 may combine the obtained converted instruction sequence with the related operand information of the ready-for-execution instruction 132 to generate macroinstructions that maybe decoded and executed by the processor 110 or microinstructions that may be directly executed, and then returns the macroinstructions or microinstructions to the processor 110 for executions. Those skilled in the art may determine which parts of the ready-for-execution instructions 132 is used for obtaining the converted instruction sequence and for generating macroinstructions or microinstructions to be executed by the processor 110 according to actual needs, which is not limited by the disclosure.

It is to be noted that each of the converted instruction sequences is programed by means of at least one native instruction or supported instruction of the processor 110. For example, the converted instruction sequence indicated by the converted instruction sequence pointer InstSeq1_Pointer is programed by means of two native instructions InstSeq1_NatInst 1 and InstSeq1_NatInst 2, but the converted instruction sequence indicated by the converted instruction sequence pointer InstSeqN_Pointer is programed by means of only one native instruction InstSeqN_NatInst 1. In the embodiment, the converted instruction sequence may be constructed from binary codes capable of being executed by the processor 110 and conform to the relevant rules of the x86 instruction set architecture. In one embodiment, the extended instruction tag 7042 in the extended instruction conversion table 704 may be codes derived from the prefix (PRE), the escape code (EOP), the opcode (MOP), and other decode information (ODI). For example, the PRE/EOP/MOP/ODI may be encrypted or hashed to protect the conversion processes of the extended instruction, which is known to those skilled in the art and is not described in detail herein. In another embodiment, the extended instructions and the converted instruction sequences corresponding to the extended instructions may be added, deleted, or updated to the extended instruction database 152 according to applications. For example, the extended instruction conversion table 704 and the converted instruction sequence table 706 may be updated through firmware updates. Specifically, the format information of the extended instruction PRE_N+1/EOP_N+1/MOP_N+1/ODI_N+1 and the corresponding converted instruction sequence InstSeqN+1_NatInst 1 . . . InstSeqN+1_NatInst M (N and M are both integers greater than 1) may be added into the extended instruction conversion table 704 and the converted instruction sequence table 706, respectively. Moreover, the converted instruction sequence pointer InstSeqN+1_Pointer, which may be added into the extended instruction conversion table 704, points to the converted instruction sequence InstSeqN+1_NatInst 1 . . . InstSeqN+1_NatInst M (the format information, the converted instruction sequences, and the converted instruction sequence pointer are not shown in FIG. 7). After updating these two tables, the original contents of the extended instruction database 152 may be modified through firmware updates. Note that in FIG. 7, although there are two tables (i.e., the extended instruction conversion table 704 and the converted instruction sequence table 706) employed for storing the extended instruction tags and the corresponding converted instruction sequences respectively, those skilled in the art should know that if the native/supported instruction of the processor 110 is not too long, the converted instruction sequence programed by means of the native/supported instruction may be directly stored after the corresponding extended instruction tag (e.g., occupying the position of the converted instruction sequence pointer 7044). Under this approach, when the control unit 702 finds that a "hit" occurs on a certain extended instruction tag, the extended instruction sequence is obtained directly from the column after the hit extended instruction tag. According to actual needs, those skilled in the art may determine whether to keep the converted instruction sequence pointer, and/or determine the storage method of the extended instruction sequence, which is not limited by the disclosure.

In one embodiment, the conversion system 150 is stored in the basic input/output system of the electronic device 100. When the system embodied with the processor 110 is turned on, the basic input/output system loads the conversion system 150 to the operating system 120. In another embodiment, the conversion system 150 may be embodied in the processor 110 driver and loaded into system memory by the operating system 120. In yet another embodiment, the conversion system 150 may be compiled into the kernel of the operating system 120 and wait for invoking after the operating system 120 starts up. In still another embodiment, the operating system 120 may disable interrupts which may interfere with the conversion operations during the conversion operation of the conversion system 150. The modifications of the embodiments do not depart from the spirit of the disclosure and should be included in the appended claims of the disclosure.

The conversion system 150 may also include an exception processing module 154. When an abnormality or an exception (e.g., the converted instruction sequence does not exist in the extended instruction database 152 or the current extended instruction being converted is unable to be executed (or is not suitable to be executed) in the current context of the processor 110) occurs in the conversion system 150 during the conversion operations, the exception processing module 154 generates an error/exception result to notify the application program 130 and the operating system 120 to take corresponding remedial steps, so that the entire electronic device 100 is prevented from crashing caused by the abnormality or exception. For example, the error/exception result may be an asserted flag (or a notification by writing a specific register) indicative of an exception occurrence, which is then returned to the application program 130 for further processing. In another embodiment, the application program 130 or the operating system 120 may skip the instruction causing this abnormality/exception, or display that the function indicated by this instruction cannot be implemented, or report an error.

Figure 2A:
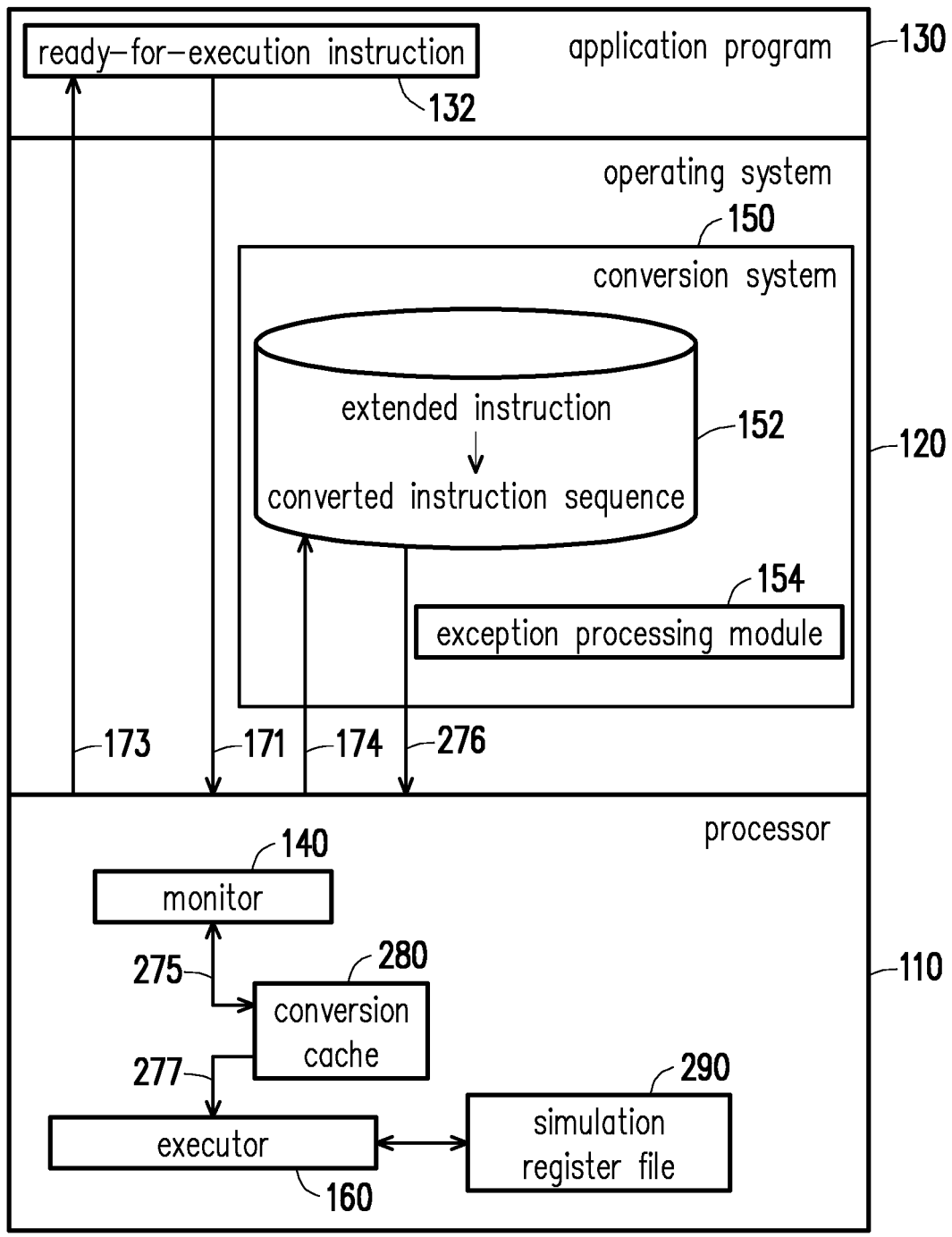
FIG. 2A is a schematic view of an electronic device embodied with a conversion device according to a second embodiment of the disclosure.

FIG. 2A is a schematic view of an electronic device 200 embodied with a conversion device according to a second embodiment of the disclosure. In FIG. 2A, the components/modules with the same number as those in FIG. 1 have the same functions as those in FIG. 1, and will not be described herein. The difference between the embodiment in FIG. 1 and the embodiment in FIG. 2A is that the electronic device 200 shown in FIG. 2A further includes a conversion cache 280 for storing the converted instruction sequence generated by the conversion system 150 and corresponding to the extended instruction. As shown in FIG. 2A, when the monitor 140 determines that the current ready-for-execution instruction 132 is an extended instruction, the monitor 140 sends the ready-for-execution instruction 132 (or the format information of the ready-for-execution instruction 132) to the conversion system 150 along the arrow 174. After the conversion system 150 searches and obtains the corresponding converted instruction sequence from the extended instruction database 152, the converted instruction sequence is returned to the processor 110 along the arrow 276. The processor 110 may directly store the converted instruction sequence into the conversion cache 280 (if the converted instruction sequence is a microinstruction sequence), and then the converted instruction sequence is sent to the executor 160 for executions along the arrow 277. In one embodiment, the converted instruction sequence may be decoded by the processor 110 (if the converted instruction sequence is a macroinstruction sequence) and then stored into the conversion cache 280, and subsequently the decoded converted instruction sequence is sent to the executor 160 for executions along the arrow 277 (the detailed implementation is illustrated later). Note that the conversion cache 280 stores the converted instruction sequences that were executed previously, so when the monitor 140 determines that the ready-for-execution instruction 132 is an extended instruction subsequently, the format information of the extended instruction is used to check whether the converted instruction sequence corresponding to the extended instruction has been stored in the conversion cache 280. Additionally, if the corresponding converted instruction sequence has been stored in the conversion cache 280, the converted instruction sequence is fetched and combined with associated operand information of the extended instruction and then sent to the executor 160 for executions.

Figure 8:
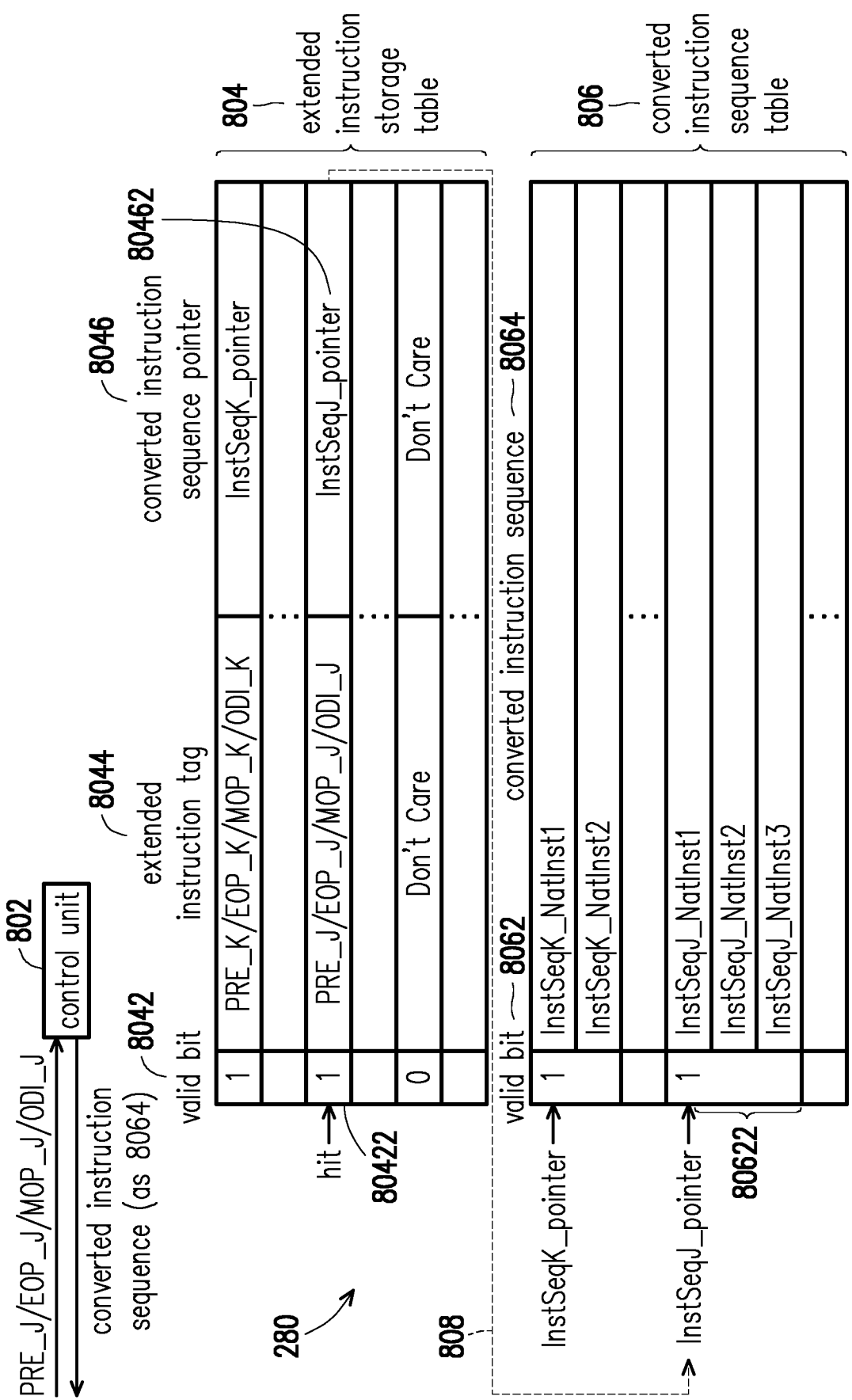
FIG. 8 is a schematic view of the structure of a conversion cache according to an embodiment of the disclosure.

FIG. 8 illustrates the structure of the conversion cache 280 in the embodiment of the disclosure. The conversion cache 280 includes a control unit 802, an extended instruction storage table 804, and a converted instruction sequence table 806. The extended instruction storage table 804 includes three parts: a valid bit 8042, an extended instruction tag 8044, and a converted instruction sequence pointer 8046. When the valid bit 8042 is set (e.g., it is set to 1), it means that the extended instruction tag 8044 and the converted instruction sequence pointer 8046 stored subsequently are valid data; on the contrary, when the valid bit 8042 is cleared (e.g., it is cleared to 0), it means that the extended instruction tag 8044 and the converted instruction sequence pointer 8046 stored subsequently are invalid data (it is shown as "Don't Care" in the extended instruction storage table 804 in FIG. 8). Therefore, if a new extended instruction and its converted instruction sequence need to be stored, an invalid row (e.g., its valid bit is 0) may be selected and overwritten. The converted instruction sequence table 806 includes two parts: a valid bit 8062 and an extended instruction sequence 8064. The valid bit 8062 and the valid bit 8042 of the extended instruction storage table 804 have the same value (if the two values are different, it means the subsequent converted instruction sequence 8064 is invalid data, which provides an additional protection for the data accuracy), and the converted instruction sequence 8064 is generated for the extended instruction in advance. When the processor 110 determines that the ready-for-execution instruction 132 is an extended instruction, the format information of the ready-for-execution instruction 132 is sent to the conversion cache 280 for searching. Subsequently, the control unit 802 compares the format information of the extended instruction with a valid extended instruction tag 8044 in the extended instruction storage table 804 (e.g., the valid bit 8042 corresponding to the extended instruction tag 8044 is set to 1). If a match is found (i.e., the format information of the extended instruction hits with one of the extended instruction tags 8044), along the indication of the converted instruction sequence pointer 8046 corresponding to the extended instruction tag 8044, the required converted instruction sequence 8064 in the converted instruction sequence table 806 is obtained and then executed. For example, if the format information of the extended instruction sent from the processor 110 are PRE_J/EOP_J/MOP_J/ODI_J, the control unit 802 compares each valid extended instruction tag 8044 with the PRE_J/EOP_J/MOP_J/ODI_J. As shown in FIG. 8, the microinstruction sequence of the extended instruction has been stored in the conversion cache 280, so a "hit" occurs (at the tag indicated by the 80422). Then, the corresponding converted instruction sequence pointer 80462 InstSeqJ_pointer may be obtained and then employed to look for the required converted instruction sequence (the microinstruction sequence) from the converted instruction sequence table 806. The converted instruction sequence 80622 is then found along the dashed-line arrow 808. As shown in FIG. 8, the converted instruction sequence 80622 is programed by means of three native instructions or supported instructions (i.e., InstSeqJ_NatInst1, InstSeqJ_NatInst2, and InstSeqJ_NatInst3) of the processor 110. Finally, the control unit 802 sends the converted instruction sequence 80622 to the processor 110 for decoding along the indication of an arrow 275, or directly sends it to the executor 160 for executions (along an arrow 277 shown in FIG. 2A). As mentioned above, if the valid bit 8062 corresponding to the converted instruction sequence 80622 pointed by the converted instruction sequence pointer 80462 is 0, it means that the converted instruction sequence 80622 stored therein is invalid, which also means that the conversion cache 280 has not stored the corresponding converted instruction sequence, so the processor 110 requests the conversion system 150 to convert the extended instruction. On the other hand, if a "hit" does not occur (i.e., the format information of the extended instruction sent from the monitor 140 does not hit with any of the extended instruction tags 8044), it means that the extended instruction has not been converted previously such that the conversion cache 280 does not hold any converted instruction sequence for it. The format information of this extended instruction is then sent to the conversion system 150 for conversion (along the arrow 174), which is illustrated later. In one embodiment, the extended instruction tag 8044 may be generated from portions of the format information. For example, only prefix/escape code/opcode (PRE/EOP/MOP) or fewer columns is used for comparisons, which should be well known to those skilled in the art and will not repeat herein.

In another embodiment, the valid bit in FIG. 8 may be replaced with a time stamp, and the format information of the extended instruction stored in the extended instruction storage table 804 and the corresponding converted instruction sequence stored in the converted instruction sequence table 806 may be updated by using the least recently used (LRU) algorithm. For example, after the conversion cache 280 is initialized, the time stamp may be cleared as 0. Subsequently, if a converted instruction sequence of an extended instruction is to be stored, a row with the "0" time stamp value may be found and the format information of the extended instruction and its converted instruction sequence are stored therein as shown in FIG. 8, and then the corresponding time stamp starts to increment (i.e., increment 1 each time). Next, if a converted instruction sequence of a new extended instruction is to be stored, a row with the time stamp "0" is searched firstly, and the time stamp starts to increment after the format information of the extended instruction and the converted instruction sequence are stored. When all the storage spaces of the conversion cache 280 are taken up and another new extended instruction sequence is to be stored, the row having the maximum time stamp value is searched, and then the searched row is overwritten by the format information and the converted instruction sequence of this new extended instruction. In another embodiment, if the information corresponding to the extended instruction stored in the conversion cache 280 is accessed again, the time stamp value corresponding to this extended instruction may be reset and then incremented again to prevent it from being replaced by any new extended instructions as well as associated converted instruction sequences. Note that the replacement algorithm used on the format information of the extended instructions and the corresponding converted instruction sequences may be replaced by other alternative algorithms, such as the least frequently used (LFU) algorithm, the not most recently used (NMRU) algorithm, or the first-in first-out (FIFO) algorithm, etc. Those skilled in the art may select the applicable algorithm according to actual needs, and the disclosure is not limited thereto. In yet another embodiment, the time stamp and the valid bit may be both adopted so that the conversion cache 280 may be accessed and protected in a favorable way, and those skilled in the art may select the implementation according to actual needs, but all equivalent modifications that do not depart from the spirit of the embodiments of the disclosure should be included in the appended claims of the disclosure.

Figure 2B:
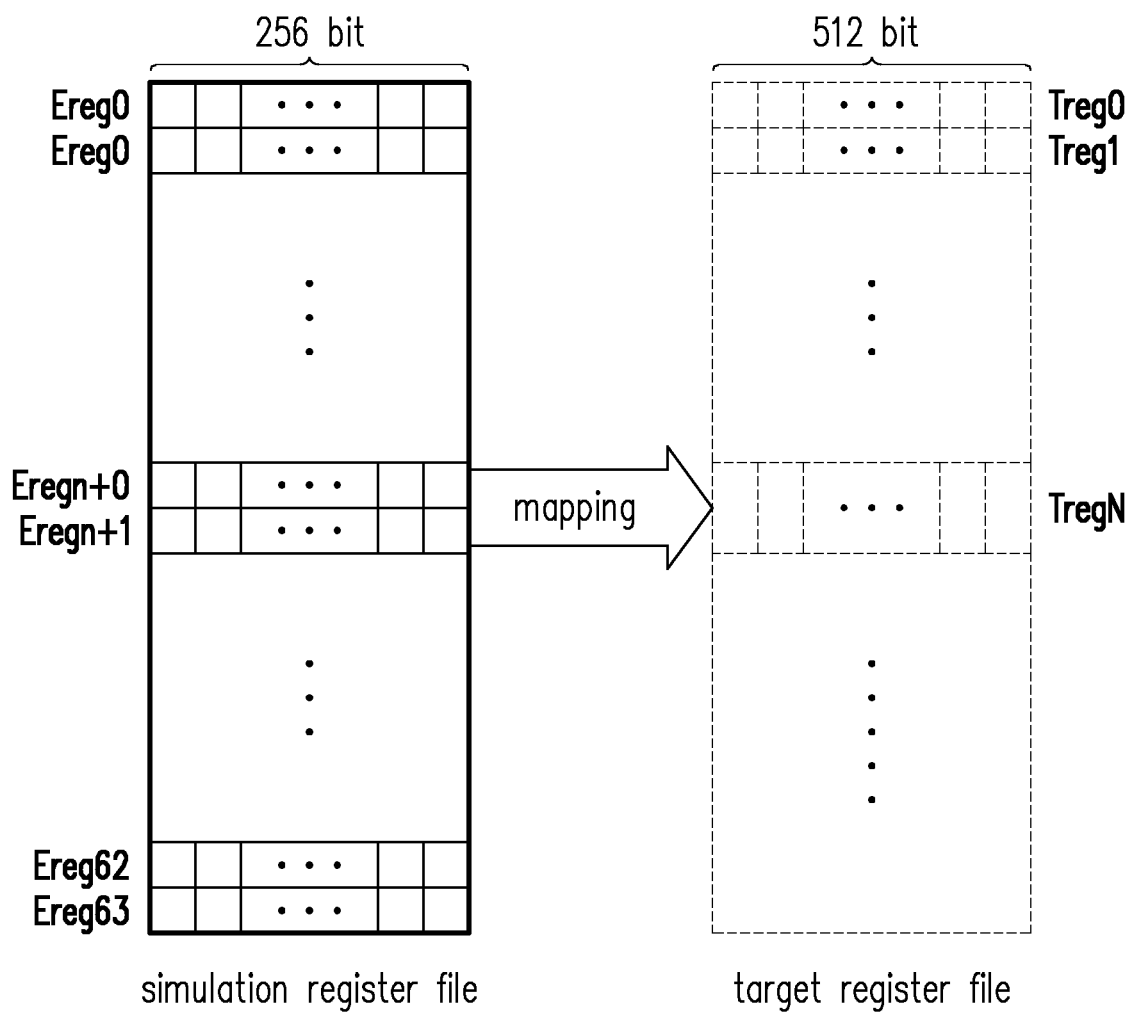
FIG. 2B is a schematic view of the mapping relationship of a register inside a simulation register file of the electronic device according to an embodiment of the disclosure.

The disposed position of the conversion cache 280 are further illustrated below. The conversion cache 280 shown in FIG. 2A is disposed inside the processor 110, but the actual position of the conversion cache 280 may vary. FIG. 2D illustrates a schematic view of a quad-core processor 110 including conversion cache 280 (the four cores are marked as core A, core B, core C, and core D respectively), and a conversion cache 280 is located inside each of the cores of the processor 110. Therefore, the stored converted instruction sequence is a microinstruction sequence (also binary codes) that is generated after at least one native instruction is decoded by the processor 110 decoder, but the extended instruction tag may still be the format information (they are basically binary codes), such as PRE/EOP/MOP/ODI, of the extended instruction. Any code useable for comparisons by the control unit 802 may be applied in the embodiment of the disclosure. When the monitor 140 determines that the ready-for-execution instruction 132 is an extended instruction, the format information of the extended instruction is sent to the conversion cache 280 along the indication of the arrow 275 to check whether the converted instruction sequence corresponding to the extended instruction is stored in the conversion cache 280. If the converted instruction sequence (that is, microinstruction sequence) corresponding to the extended instruction is found in the conversion cache 280 (e.g., a "hit" occurs), the microinstruction sequence will be obtained and combined with the operand information of the current ready-for-execution instructions 132, and then fed to the executor 160 for executions (along the arrow 277) bypassing the conversion process of the conversion system 150. In contrast, when the ready-for-execution instruction 132 is an extended instruction but the conversion cache 280 does not store the microinstruction sequence corresponding to the extended instruction, as mentioned above, the processor 110 sends the ready-for-execution instruction 132 (or only the format information of the ready-for-execution instruction 132) to the conversion system 150 (along the arrow 174), and then the converted instruction sequence corresponding to the extended instruction is returned from the conversion system 150 (along the arrow 276). In addition, after the processor 110 decodes the obtained converted instruction sequence and obtains the microinstruction binary codes (if the converted instruction sequence is a macroinstruction), the microinstruction binary codes are stored into the conversion cache 280 along the indication of the arrow 276 and sent to the executor 160 for executions. In another embodiment, if the converted instruction sequence sent from the conversion system 150 to the processor 110 is a microinstruction sequence which does not need to be decoded again, this microinstruction sequence is stored into the conversion cache 280 and fed to the executor 160 for executions (along the arrow 277). Under the architecture shown in FIG. 2D, each core of the processor 110 individually stores its own converted instruction sequence corresponding to the extended instruction that has been converted, which may be imparticipable with the other processor 110 cores.

Figure 2C:
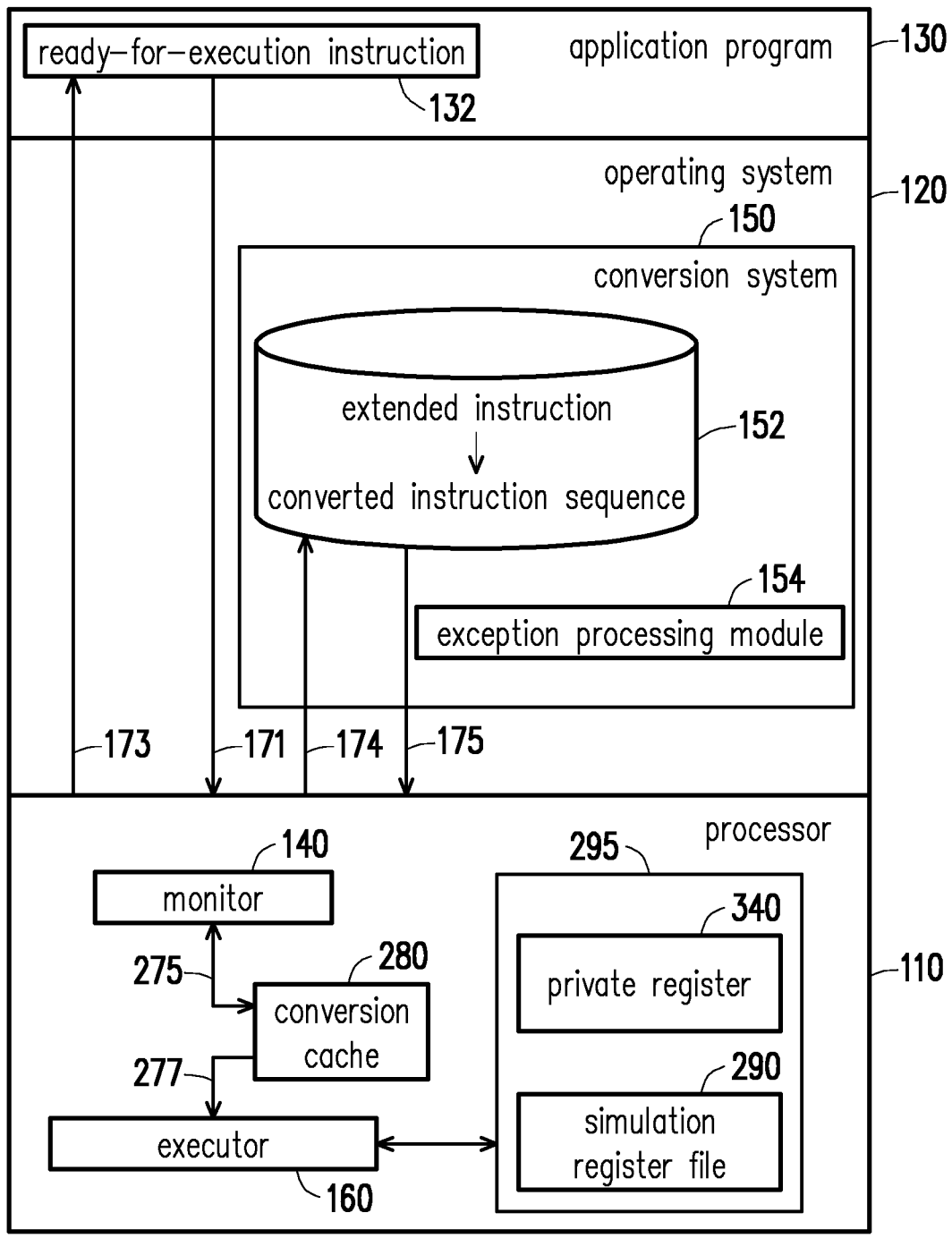
FIG. 2C is a schematic view of an electronic device embodied with a conversion device according to a third embodiment of the disclosure.
Figure 2D:
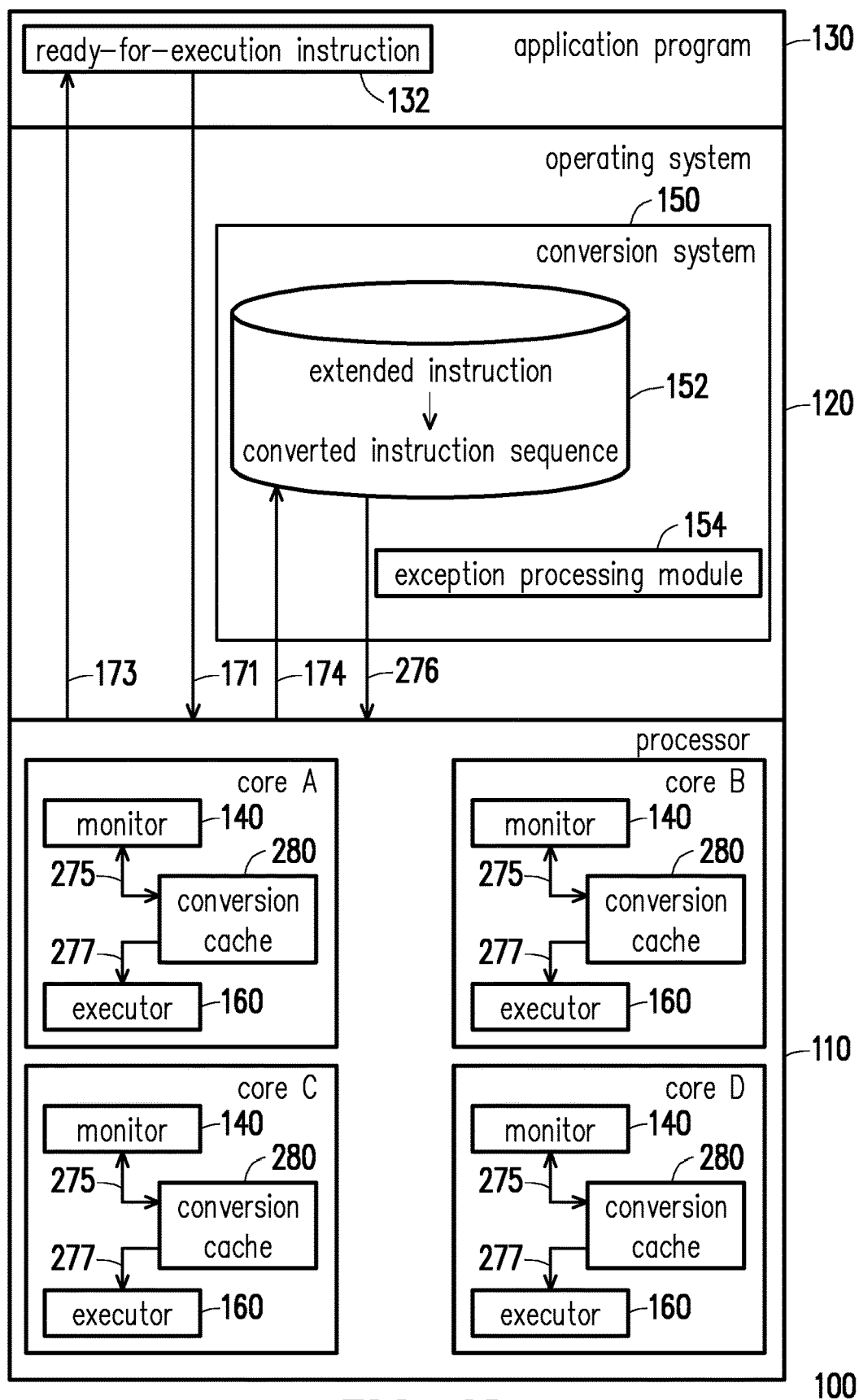
FIG. 2D is a schematic view of a quad-core processor including conversion caches.
Figure 2E:
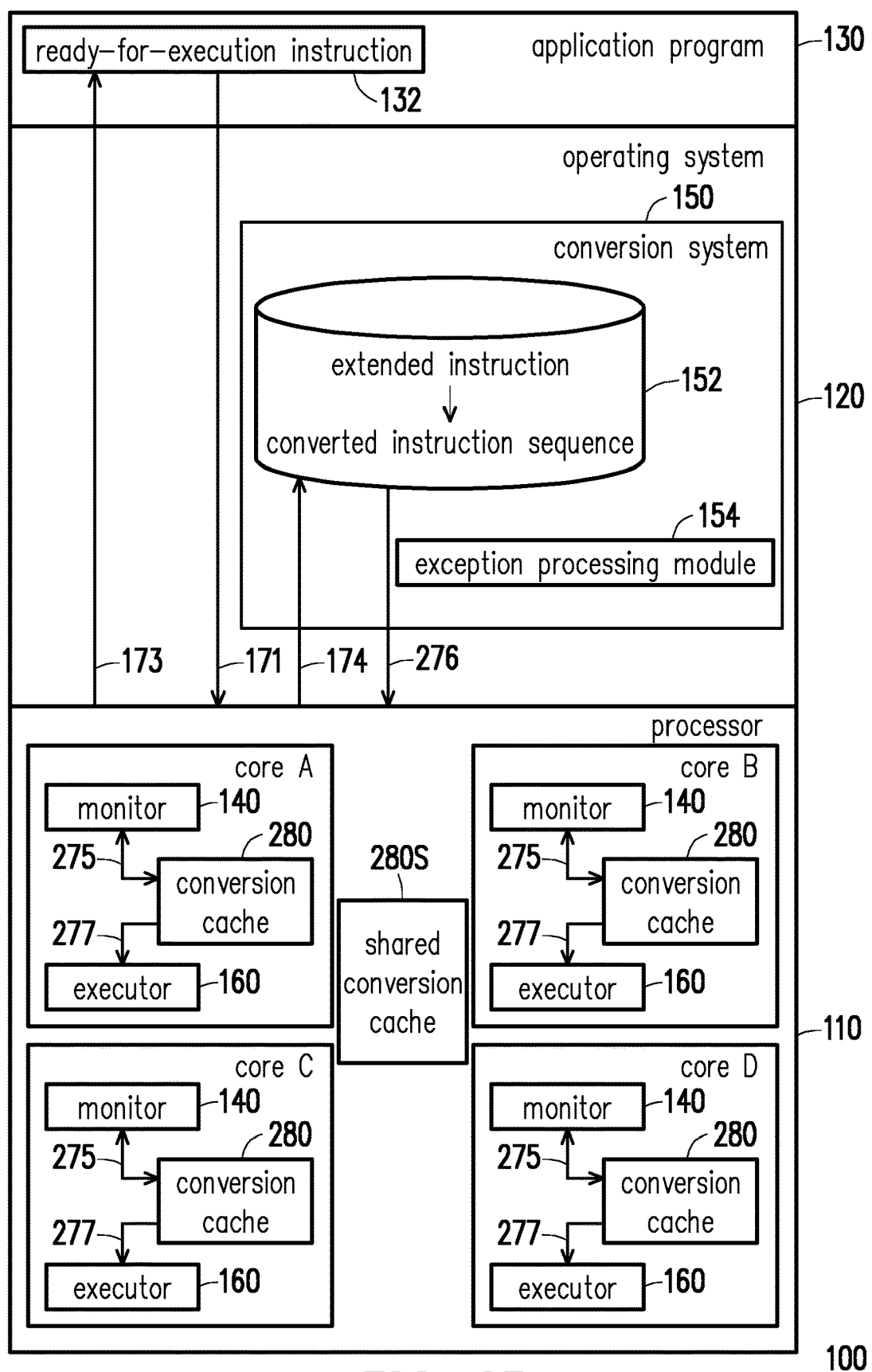
FIG. 2E illustrates an alternative disposition of a conversion cache.

FIG. 2E illustrates an alternative disposition of a conversion cache. As shown in FIG. 2E, in addition to the conversion cache 280 disposed in each cores of the processor 110, a shared conversion cache 280S is disposed in an uncore region (e.g., L3 cache) of the processor 110, in which the converted instruction sequences corresponding to the extended instructions that have been accessed by all the cores of the processor 110 are stored. The information stored in the uncore region may be shared by all the processor 110 cores, so that each of the converted instruction sequences corresponding to the extended instructions stored in the shared conversion cache 280S may be shared by other cores of the processor 110, regardless of which of the processor 110 core originally accessed the converted instruction sequence through the conversion system 150. When a monitor 140 of the processor 110 cores determinates that an ready-for-execution instruction 132 is an extended instruction and needs to obtain the corresponding converted instruction sequence, the ready-for-execution instruction 132 (or only its format information) may be first sent to the shared conversion cache 280S to check whether the shared conversion cache 280S stores the converted instruction sequence corresponding to the extended instruction therein (the shared conversion cache 280S may also adopt the architecture of FIG. 8 to obtain the required converted instruction sequence, but the converted instruction sequence is programed by means of macroinstructions). If a "hit" occurs, the previously stored converted instruction sequence is directly obtained from the shared conversion cache 280S and sent to the processor 110 core, which then sends the converted instruction sequence to the instruction cache. The supported instructions in the converted instruction sequence are decoded as a microinstruction sequence, which is sent to the pipeline circuitry (e.g., the executor 160) for executions and stored in their own conversion cache 280. On the other hand, if the shared conversion cache 280S in the uncore region does not stored the converted instruction sequence corresponding to the extended instruction, the conversion system 150 is then requested to convert the extended instruction. After the required converted instruction sequence corresponding to the extended instruction is obtained and stored into the shared conversion cache 280S in the uncore region, this required converted instruction sequence is sent to the processor 110 core requesting for conversions. This required converted instruction sequence stored in the shared conversion cache 280S in the uncore region may be participable with other cores of the processor 110, thereby preventing repetitive conversions on the same extended instruction by the conversion system 150. In addition, the corresponding address or size of the shared conversion cache 280S may be configured by updating the processor 110 driver. Regarding the converted instruction sequence corresponding to the extended instruction and the corresponding conversion cache, those skilled in the art may design and configure by themselves according to applications, which is not limited in the disclosure.

In another embodiment, regardless of whether the conversion cache 280 is disposed inside a processor core or in an uncore region (i.e., the shared conversion cache 280S) for all the processor cores to share the converted instruction sequence, anyone of the stored converted instruction sequences is maintained without being overwriting/changing during context switches by the processor 110, so that the converted instruction sequence corresponding to the extended instruction may be used by as many application programs 130 as possible without causing unnecessary instruction conversions derived from context switches.

The instruction conversion device in the electronic device 200 further includes a simulation register file 290. The simulation register file 290 is an additional register file making a storage provision when executing the extended instruction that includes a flag indicating whether the ready-for-execution instruction 132 is an extended instruction, and/or provides a storage for the execution result of the processor, etc. FIG. 2B is a schematic view of the mapping relationship of a register inside a simulation register file 290 of the electronic device 200 according to an embodiment of the disclosure. As shown in FIG. 2B, a set of 256-bit simulating registers Ereg0, Ereg1 . . . Eregn+0, Eregn+1 . . . Ereg62, and Ereg63 (i.e., totally 64 256-bit simulation registers) are disposed inside the simulation register file 290 of the processor 110, and these 256-bit registers are read, written and operated by means of specific micro-operations of the processor 110. Supposing the longest register inside the processor 110 is 256-bit long. When one operand within the extended instruction is a 512-bit register, executional errors may be caused since none of the current registers of the processor 110 can completely/individually store whole this 512-bit register. However, the problem can be solved easily by simulating this 512-bit register through the simulation registers in the simulation register file 290. For example, if this 512-bit register is TregN, two 256-bit simulation registers Eregn+0 and Eregn+1 in the simulation register file 290 may be used to respectively map to two parts of TregN: the high 256-bit part and the low 256-bit part of this 512-bit register TregN. For example, the extended instruction including this 512-bit register is as follows:

VADDPS zmm1, zmm2, zmm3 (1)

zmm1, zmm2, and zmm3 are all 512-bit registers. Basically, the extended instruction (1) is simulated by the following two native instructions:

Addps_lO em1, em2, em3; (2)

Addps_hi em4, em5, em6; (3)

The high 256-bit and low 256-bit of the operands zmm1, zmm2, and zmm3 are simulated through em1/em4, em2/em5, and em3/em6 respectively. Since the 256-bit registers may be accessed by the processor 110, the execution result required by the extended instruction (1) may be generated by executing two native instructions (2) and (3) on the processor 110. Note that the aforementioned embodiment is merely used to exemplarily show how two 256-bit registers are adopted to map/simulate a 512-bit register, which does not mean that the disclosure is limited to simulate mappings between two different register lengths. Also note that the mapping implementations between two register lengths should be well known for those skilled in the art, such that associated detailed descriptions are omitted in the specification.

Note that as shown in FIG. 2A, the simulation register file 290 is also coupled to the executor 160. If the ready-for-execution instruction 132 is determined as an extended instruction by the monitor 140 and the simulation register file 290 stores the relevant information (including the execution result) of this ready-for-execution instruction 132, the stored information is kept in the simulation registers and makes provisions for subsequent operations (e.g., when the subsequent instruction and the current extended instruction have a dependency). In other words, the processor 110 may execute an extended instruction A and store its execution result in the simulation register file 290. If the processor 110 continues to execute the next instruction B, by which the execution result of the extended instruction A is required, the executor 160 may read the execution result from the simulation register file 290 and then execute the instruction B. Also taking a VADDPS as an example, assume the extended instruction A is the aforementioned VADDPS instruction (i.e., the above instruction (1)) and this VADDPS instruction is completed executed with its execution result being stored into two 256-bit registers em1/em4 to simulate the 512-bit register zmm1. Subsequently, if the instruction B needs to refer to the register zmm1, whose contents may be obtained according to the mapping relationship between the register zmm1 and the simulating registers em1/em4. The skilled persons should be aware of how the required contents are accessed such that associated detailed descriptions are not given here.

Refer to FIG. 2C which is a schematic view of an electronic device embodied with a conversion device according to a third embodiment of the disclosure. In comparison with the electronic devices 100/200 in FIGS. 1 and 2A, the simulation register file 290 and the private registers 340 of the embodiment are integrated into a simulation storage unit 295, and the contents stored in the simulation storage unit 295 may be used when executing the subsequent instructions, and will not be overwritten or cleared when the processor 110 switches current context to another. Those skilled in the art may decide if it is necessary to integrate these two modules together in a single one according to their applications. In another embodiment, the private registers 340 may be incorporated into the monitor 140. FIGS. 4A to 4C and FIGS. 3A to 3C are used to illustrate the operations of the private registers 340 detailedly in the subsequent paragraphs.

Figure 3A:
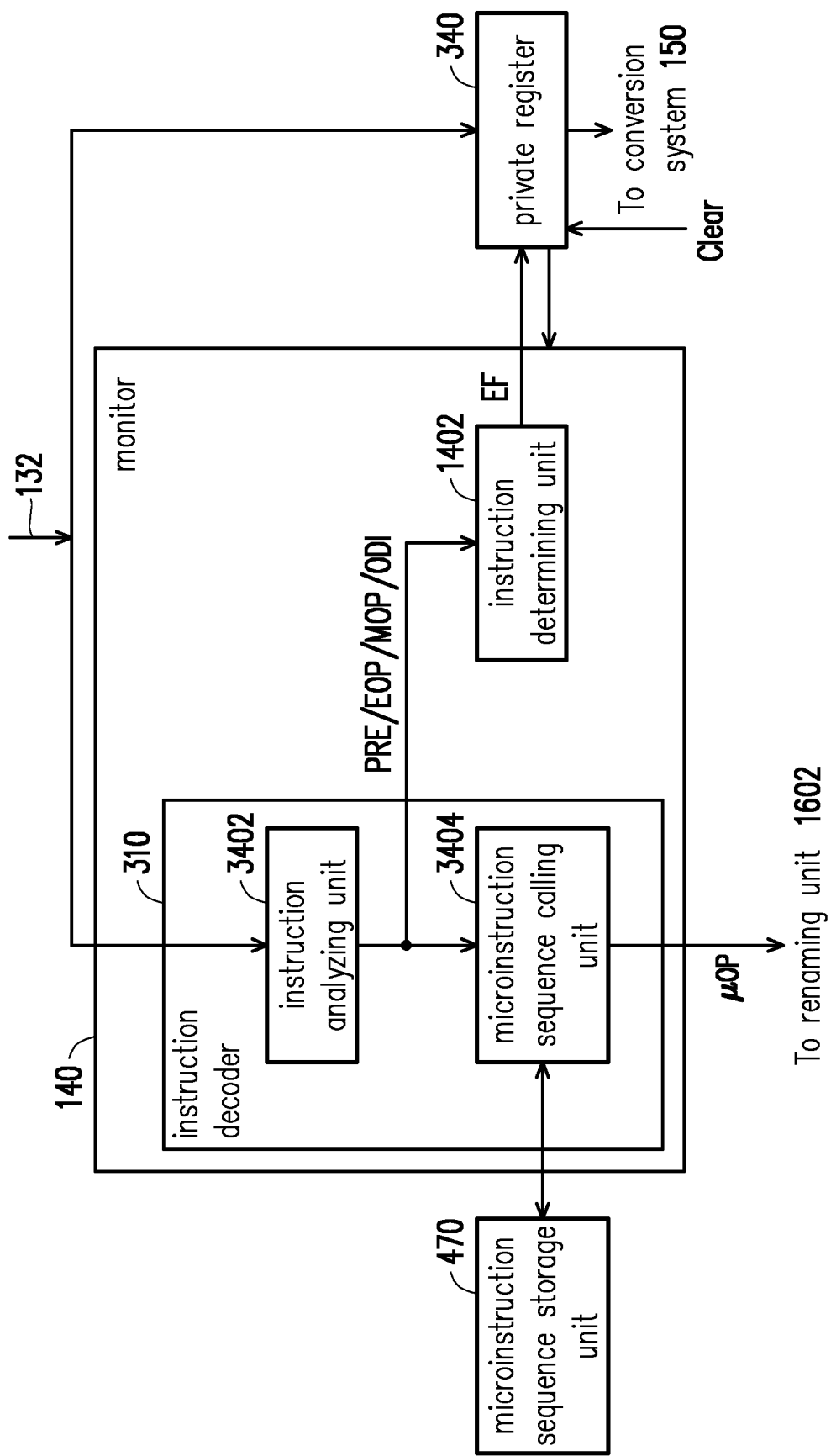
FIG. 3A is a functional block view of a monitor in the processor of the first embodiment according to the disclosure.
Figure 4A:
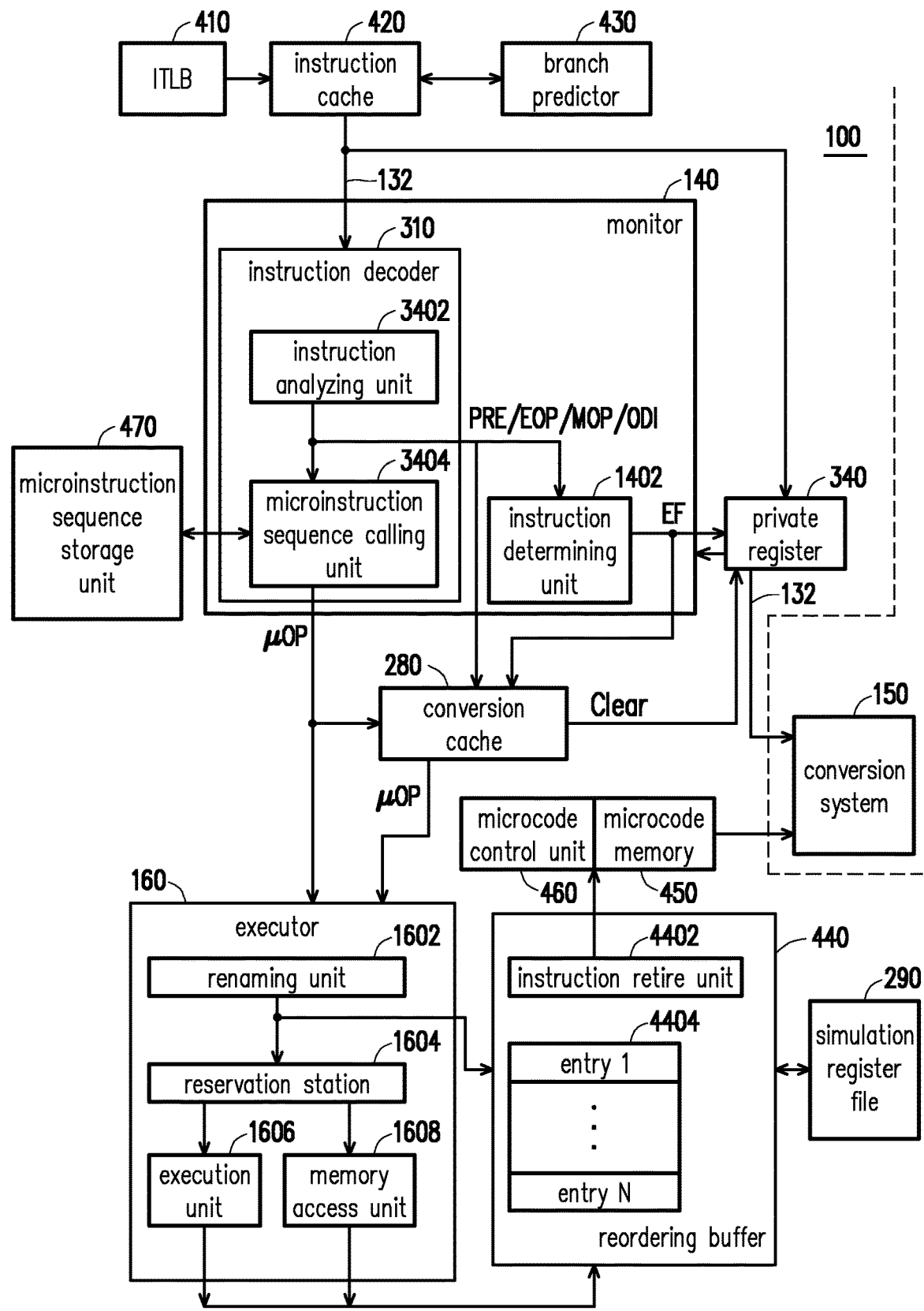
FIG. 4A is a detailed structural view of the processor according to an embodiment of the disclosure.

Next, FIGS. 3A and 4A illustrate the internal operations of the processor 110 detailedly. FIG. 4A is a detailed structural view of the processor 110 according to an embodiment of the disclosure. In addition to the monitor 140, the processor 110 includes the conversion cache 280, the executor 160, and the simulation register file 290, an instruction translation lookaside buffer ITLB 410, an instruction cache 420, a branch predictor 430, a reordering buffer 440, a microcode memory 450, a microcode control unit 460, and the private registers 340. The instruction translation lookaside buffer ITLB 410 is adapted to fetch the address of the required ready-for-execution instructions, such as the address of instructions derived from the application program (i.e., the ready-for-execution instructions 132). The instruction cache 420 is adapted to obtain the required ready-for-execution instruction according to the address thereof. The branch predictor 430 and the instruction cache 420 operate together, wherein the branch predictor 430 predicts if a branch is taken or not, and stores the branch instruction that is predicted into the instruction cache 420. The private registers 340 includes an emulation flag (EF) to indicate whether the current ready-for-execution instruction 132 is a decodable extended instruction. In addition, the private registers 340 also includes a space for storing the ready-for-execution instruction 132, and the ready-for-execution instruction 132 (or the format information of the ready-for-execution instruction 132) stored in the private registers 340 is provided to the conversion system 150 which is called to convert the ready-for-execution instruction 132. The use of the emulation flag EF and the storage approach of the extended instruction are illustrated in detail in the subsequent paragraphs. Furthermore, the executor 160 further includes a renaming unit 1602, a reservation station 1604, an execution unit 1606, and a memory access unit 1608 adapted to execute the micro-instruction sequence (generated by an instruction decoder 310) corresponding to the ready-for-execution instruction 132 to complete the function indicated by the ready-forexecution instruction 132. FIG. 3A is a functional block view of the monitor 140 in the processor 110 of the first embodiment. The monitor 140 includes the instruction decoder 310 and an instruction determining unit 1402. The instruction decoder 310 further includes an instruction analyzing unit 3402 and a microinstruction sequence calling unit 3404, wherein the instruction analyzing unit 3402 is coupled to the instruction determining unit 1402, the instruction determining unit 1402 is further coupled to the private register 340, and the microinstruction sequence calling unit 3404 is coupled to the microinstruction sequence storage unit 470. The conversion cache 280 is coupled to the microinstruction sequence calling unit 3404 and the instruction determining unit 1402. The conversion cache 280 stores the microinstruction sequence sent from the microinstruction sequence calling unit 3404 when the emulation flag EF is asserted, and the microinstruction sequence stored therein is accessed again when executing the same extended instruction subsequently.

When the ready-for-execution instruction 132 is sent from the instruction cache 420 to the monitor 140, the instruction analyzing unit 3402 in the instruction decoder 310 firstly performs a format analysis on it. After the format information, such as a prefix (PRE), an escape code (EOP), an opcode (MOP), and other decode information (ODI) is generated, the generated format information is sent to both the microinstruction sequence calling unit 3404 and the instruction determining unit 1402 at the same time. The microinstruction sequence calling unit 3404 in the instruction decoder 310 then decodes the format information to learn the function indicated by the ready-for-execution instruction 132, and then the corresponding microinstruction sequence is obtained from the microinstruction sequence storage unit 470 according to the function indicated by the ready-for-execution instruction 132. The microinstruction sequence incorporates with the relevant operand information (e.g., the addressing information of the operands) of the ready-for-execution instructions 132 to generate microinstructions which is then sent to the executor 160 (e.g., to the renaming unit 1602). The microinstruction sequence is sent to both the reservation station 1604 and the reordering buffer 440 after associated renaming operations are accomplished. The reservation station 1604 sends the microinstruction sequence to the execution unit 1606 or the memory access unit 1608 for further processing according to the type of the microinstruction sequence. The reordering buffer 440 includes an instruction retire unit 4402 and a microinstruction buffer 4404, and the microinstruction buffer 4404 includes a plurality of instruction entries for storing the microinstruction sequence redirected from the renaming unit 1602. After the microinstruction is completed executed, the execution unit 1606 or the memory access unit 1608 notifies the reordering buffer 440 to retire the instruction according to the original program order of the microinstruction.

The following describes the manipulations when the processor 110 executes the ready-for-execution instruction 132 as an extended instruction. The instruction determining unit 1402 of FIG. 3A determines whether the ready-for-execution instruction 132 is an extended instruction according to its format information. If the ready-for-execution instruction 132 is an extended instruction, the emulation flag EF is asserted and the private registers 340 are instructed to store the ready-for-execution instruction 132. On the other hand, as mentioned above, when the ready-for-execution instruction 132 is an extended instruction, the microinstruction sequence calling unit 3404 generates a no operation (NOP) instruction because the format information may not be correctly decoded. Therefore, when the no operation instruction is the oldest instruction in the reordering buffer 440, the instruction retire unit 4402 checks the emulation flag EF and finds that the emulation flag EF has been asserted, so the interrupt service program calling the conversion system 150 is invoked by the instruction retire unit 4402 to convert the extended instruction. In one embodiment, the interrupt service program adapted to call the conversion system 150 may be programmed by modifying the interrupt service program corresponding to #UD which is called when an error/exception occurs during incorrectly decoding an instruction, or by defining another new interrupt service program. For example, when the no operation instruction that causes #UD is retired and the interrupt service program corresponding to #UD is called, the interrupt service program corresponding to #UD may be modified to firstly check the emulation flag EF, and the conversion system 150 is requested by the operating system 120 to implement conversion operations when the emulation flag EF is asserted. Alternatively, when the emulation flag EF is not asserted, a conventional exception program is called for processing the error caused by incorrectly decoding the instruction. In another embodiment, when the no operation instruction that causes such a decoding error on the instruction is retired, the instruction retire unit 4402 first checks the status of the emulation flag EF. When the emulation flag EF is asserted, a self-defined interrupt service program (e.g., the processor 110 designer may select a vector number, such as 20H, from the self-defined vector numbers in the interrupt vector table and defines an interrupt vector #NE (NE is the abbreviation of Non-support instruction Emulator)) to invoke the conversion system 150 by means of the operating system 120. Please note when the interrupt service program calls the conversion system 150, the interrupt service program may send the ready-for-execution instruction 132 (or the format information of the ready-for-execution instruction 132 only) to the conversion system 150 as a parameter. In one embodiment, the interrupt service program may send the address of the ready-for-execution instruction 132 (e.g., the register address of the private registers 340 storing the ready-for-execution instruction 132, or the address of the storage space which is accessible by the conversion system 150 for storing the ready-for-execution instruction 150) to the conversion system 150. Furthermore, the interrupt service program (that is the interrupt service program corresponding to #UD or the self-defined interrupt service program #NE) adapted to invoke the conversion system 150 may be a microcode stored in the microcode memory 450 and called by the microcode control unit 460 (in one embodiment, the interrupt service program may also be constructed from a state machine and a combinational logic circuit in the microcode control unit 460), or called via the address of the microcode stored in the microcode memory 450. In one embodiment, when calling the conversion system 150 to convert the extended instruction through the interrupt request, the operating system 120 is requested to execute the conversion system 150 through a system call. For example, if the conversion system 150 is a callback function, the ready-for-execution instruction 132 (or the format information thereof) may be a parameter sent to the callback function, and the converted instruction sequence is returned to the processor 110 after the callback function has converted the ready-for-execution instruction 132. Additionally, in one embodiment, the conversion system 150 is called through an internal interrupt or a trap. For example, the processor 110 designer may define an interrupt vector #NE, and the conversion system 150 is called by entering the kernel of the operating system through the interrupt vector #NE, which is known to those skilled in the art and is not described in detail herein. In yet another embodiment, each of the instruction entries of the reordering buffer 440 further includes an emulation flag field for storing the emulation flag EF of the microinstruction. Therefore, when the ready-for-execution instruction 132 is an extended instruction, because the ready-for-execution instruction 132 fails to be decoded by the microinstruction sequence calling unit 3404, the instruction decoder 310 generates a no operation instruction. At the same time, the instruction determining unit 1402 determines that the ready-for-execution instruction 132 is an extended instruction, so the emulation flag EF is asserted and therefore the asserted emulation flag EF accompanying the no operation instruction is sent to the renaming unit 162 and the reordering buffer 440. Accordingly, when the instruction retire unit 4402 of the reordering buffer 440 retires the no operation instruction, the interrupt service program is invoked to call the conversion system 150 to convert the ready-for-execution instruction 132 (that is, the extended instruction) because the emulation flag EF accompanying the no operation instruction is asserted. Please note if this accompanied emulation flag EF is not asserted, the instruction retire unit 4402 calls the conventional interrupt service program through the interrupt vector #UD (the abbreviation of un-defined) to manipulate the error/exception of incorrectly decoding the instruction, which is a known exception processing approach and is not described herein.

When the converted instruction sequence is sent from the conversion system 150 to the processor 110, it may be performed through a jump or a call operation. Since the converted instruction sequence is composed of instructions that the processor 110 may execute accurately, it is necessary to clear the emulation flag EF stored in the private registers 340. For example, the first instruction of the converted instruction sequence may be used to clear the emulation flag EF, or the processor 110 clears the emulation flag EF after the last instruction of the converted instruction sequence is executed, which means that the simulation operation of the current ready-for-execution instruction 132 has been completed. Therefore, if a subsequently ready-for-execution instruction 132 is an extended instruction as well, the emulation flag EF is asserted again and the converted instruction sequence corresponding to the extended instruction may be called again. In addition, as mentioned above, when the processor 110 receives a converted instruction sequence (that is composed of macroinstructions), the converted instruction sequence is first decoded into a microinstruction sequence, which is then stored in the conversion cache 280 and sent to a pipeline circuitry for executions subsequently. Furthermore, when the converted instruction sequence corresponding to the ready-for-execution instruction 132 has been stored in the conversion cache 280, the conversion cache 280 sends a clear signal to the private registers 340 to clear the emulation flag EF and the extended instruction stored therein, which means that the current converted instruction sequence has been obtained before, such that there is no need to call the conversion system 150 to perform conversion operations again.

The manner in which the processor 110 receives the converted instruction sequence through pins is illustrated as follows. In one embodiment, the processor 110 may receive the converted instruction sequence through existing data pins. In another embodiment, the processor 110 may be specifically designed to include at least one specific pin PIN, so that the converted instruction sequence converted by the conversion system 150 may be directly fed into the processor 110 through the specific pin PIN. In yet another embodiment, when the converted instruction sequence is programed by means of microinstructions, it can be directly stored into the conversion cache 280, and then sent to the pipeline circuitry (e.g., the renaming unit 162 in the executor 160 . . . etc.) for executions. In still another embodiment, when the converted instruction sequence is programed by means of macroinstructions, which is fed into the instruction cache 420, decoded into a microinstruction sequence by the instruction decoder 310, and finally stored into the conversion cache and sent to the pipeline circuitry for executions. In one embodiment, the specific pin PIN may be common I/O pins shared by other instructions, and the emulation flag EF is used to determine whether the input information is a converted instruction sequence. Those skilled in the art may decide their implementation approaches according to actual needs, which is not limited in the disclosure. In still another embodiment, a dedicated buffer may be disposed in the processor 110 to read the converted instruction sequence composed of microinstructions, wherein the converted instruction sequence read from the dedicated buffer is obtained by reading and writing a model specific register (MSR) by a control unit (e.g., constructed from a software). For example, when the converted instruction sequence composed of microinstructions is read, the address of the model specific register may be written into a first register (e.g., ECX) and the physical address of the dedicated buffer may be written into a second register (E.g. EDX:EAX), then a write-to-model-specific-register (WRMSR) instruction is executed to store the converted instruction sequence in the dedicated buffer into the model specific register, and finally the processor 110 executes a read-from-model-specific-register (RDMSR) instruction to read the converted instruction sequence from the model specific register and then to store this converted instruction sequence into the conversion cache 280. Accordingly, in this embodiment, the converted instruction sequence composed of microinstructions may be directed to the processor 110 by reading and writing a model specific register (without any additional pin). In addition, if the converted instruction sequence contains more than one microinstructions, the foregoing steps may be repeated to obtain a complete microinstruction sequence.

In one embodiment, the microcode control unit 460 may be constructed from a state machine and a combinational logic circuit to read the microcode memory 450. In another embodiment, the operation of calling the interrupt service program may be constructed as an individual interrupt control unit or module (e.g., the interrupt control unit under the RISC/RISC-V architecture); in yet another embodiment, the interrupt service program may be called through the address of the microcode stored in the microcode memory 450. Those skilled in the art may select implementations according to their applications, which is not limited in the disclosure. In still another embodiment, an interrupt preprocessing unit (e.g., the microcode control unit 460 is constructed as the interrupt preprocessing unit, or the interrupt control unit under the RISC/RISC-V architecture may be modified as an individual interrupt preprocessing unit) may be adapted to invoke the corresponding interrupt service program to call a simulation module 122 when the no operation instruction corresponding to the ready-for-execution instruction 132 (currently the extended instruction) is retired. Additionally, the number of the interrupt service program corresponding to #UD may be different on various processor architectures. For example, this number may be 06H in an X86 processor and may be 0x4H in an ARM processor. Moreover, the range of the self-defined vector reserved for the processor designer in each processor architecture may be different (e.g., in the X86 processor, the range is 0x20H to 0xFFH). The processor designer may select a number from those reserved ones for the #NE and write an interrupt service program after under his/her instruction set architecture, which is not limited in the disclosure.

Figure 3B:
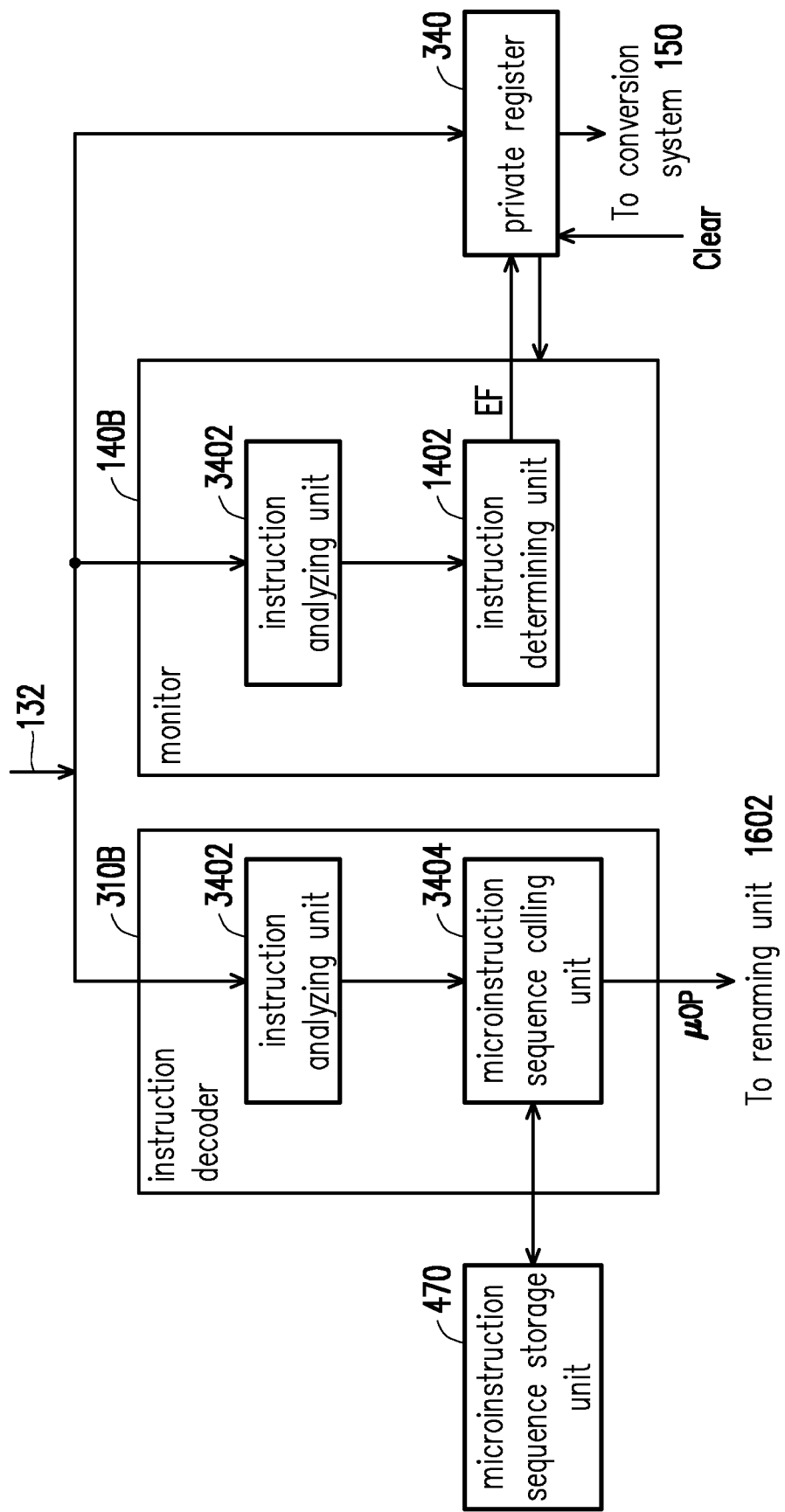
FIG. 3B is a block view of a monitor in the second embodiment of the disclosure.

FIG. 3B is a block view of a monitor in the second embodiment of the disclosure. In FIG. 3, the components/modules with the same reference numerals as those in FIG. 3A have the same functions as those in FIG. 3A, so the descriptions of their functions is not repeated herein. Compared to FIG. 3A, the monitor 140B and the instruction decoder 310B in FIG. 3B are separated into two different modules, and both may receive the ready-for-execution instructions 132 simultaneously. Therefore, the monitor 140B also needs to include the instruction analyzing unit 3402 to analyze the format of the ready-for-execution instruction 132, and sends the format information to the instruction determining unit 1402 to determine whether the ready-for-execution instruction 132 is an extended instruction. On the other hand, the instruction decoder 310B further includes the instruction analyzing unit 3402 and the microinstruction sequence calling unit 3404, and the microinstruction sequence calling unit 3404 obtains the required microinstruction sequence from the microinstruction storage unit 470 according to the format information of the ready-for-execution instruction 132, wherein the format information generated by the instruction analyzing unit 3402. Since the instruction decoder 310B and the monitor 140B are separated in FIG. 3B, two independent modules may be designed/built in the processor 110, wherein the instruction decoder 310B may adopt the conventional instruction decoder architecture, and the monitor 140B may duplicate the instruction analyzing unit 3402 in the instruction decoder 310 as the provisions of analyzed format information for the instruction determining unit 1402 to determine if an instruction conversion is needed. In one embodiment, since the extended instruction is a well-known information with fixed format contents, after analyzing the format information of the extended instruction, the processor 110 designer may adopt a combinational logic circuit or other similar design methods to construct the instruction determining unit 1402 so as to determine whether an instruction is an extended instruction.

Figure 3C:
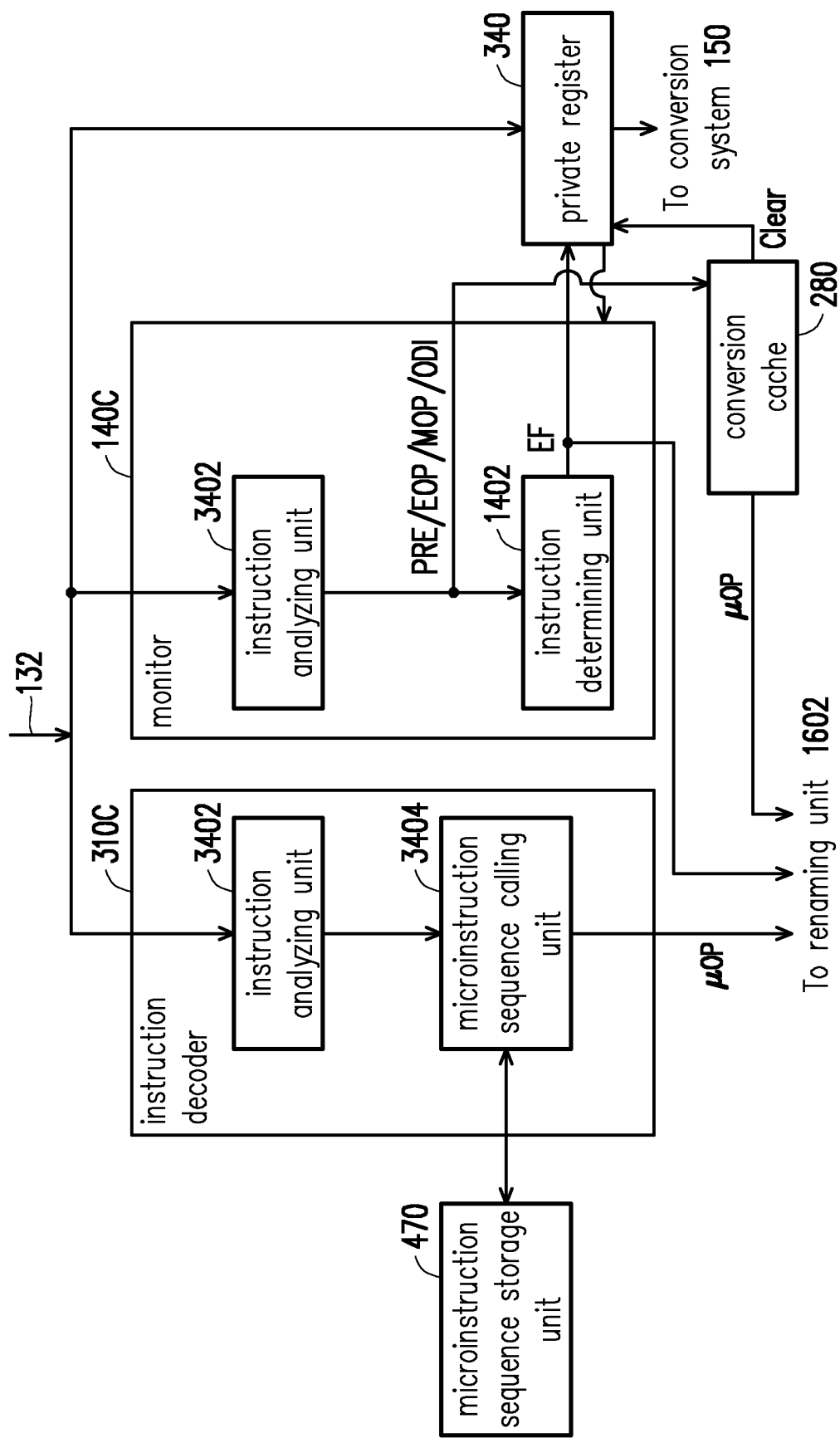
FIG. 3C is a block view of a monitor in the third embodiment of the disclosure.

FIG. 3C is a block view of a monitor in the third embodiment of the disclosure. In FIG. 3C, the components/modules with the same reference numerals as those in FIG. 3A and FIG. 3B have the same functions as that in FIG. 3A and FIG. 3B, so the descriptions of their functions is not repeated herein. Compared to FIG. 3A, the monitor 140C and the instruction decoder 310C in FIG. 3C are separated into two different modules as well, and both may receive the ready-for-execution instructions 132 simultaneously. Therefore, the monitor 140C may also include the instruction analyzing unit 3402 to analyze the format of the ready-for-execution instruction 132 and then forward the analyzed format information to the instruction determining unit 1402 to determine whether the ready-for-execution instruction 132 is an extended instruction. However, unlike the monitor 140B in FIG. 3B, the instruction determining unit 1402 forwards the emulation flag EF to the executor 160 (e.g., the renaming unit 1602) and the conversion cache 280. In addition, the format information of the ready-for-execution instruction 132 may also be sent to the conversion cache 280 for comparisons, and when the comparison is successful (i.e., when the converted instruction sequence corresponding to the ready-for-execution instruction 132 that is currently the extended instruction is stored in the conversion cache 280), a clear signal is sent to the private registers 340 to clear both the emulation flag EF and the format information of the ready-for-execution instruction 132 stored in the private registers 340 after obtaining the converted instruction sequence, which means the current converted instruction sequence has been obtained, and there is no need to request the conversion system 150 to convert the ready-for-execution instruction 132. Note that since the instruction decoder 310C and the monitor 140C in FIG. 3C are also two separate modules, two independent/individual modules may be designed/built in the processor 110.

Figure 4B:
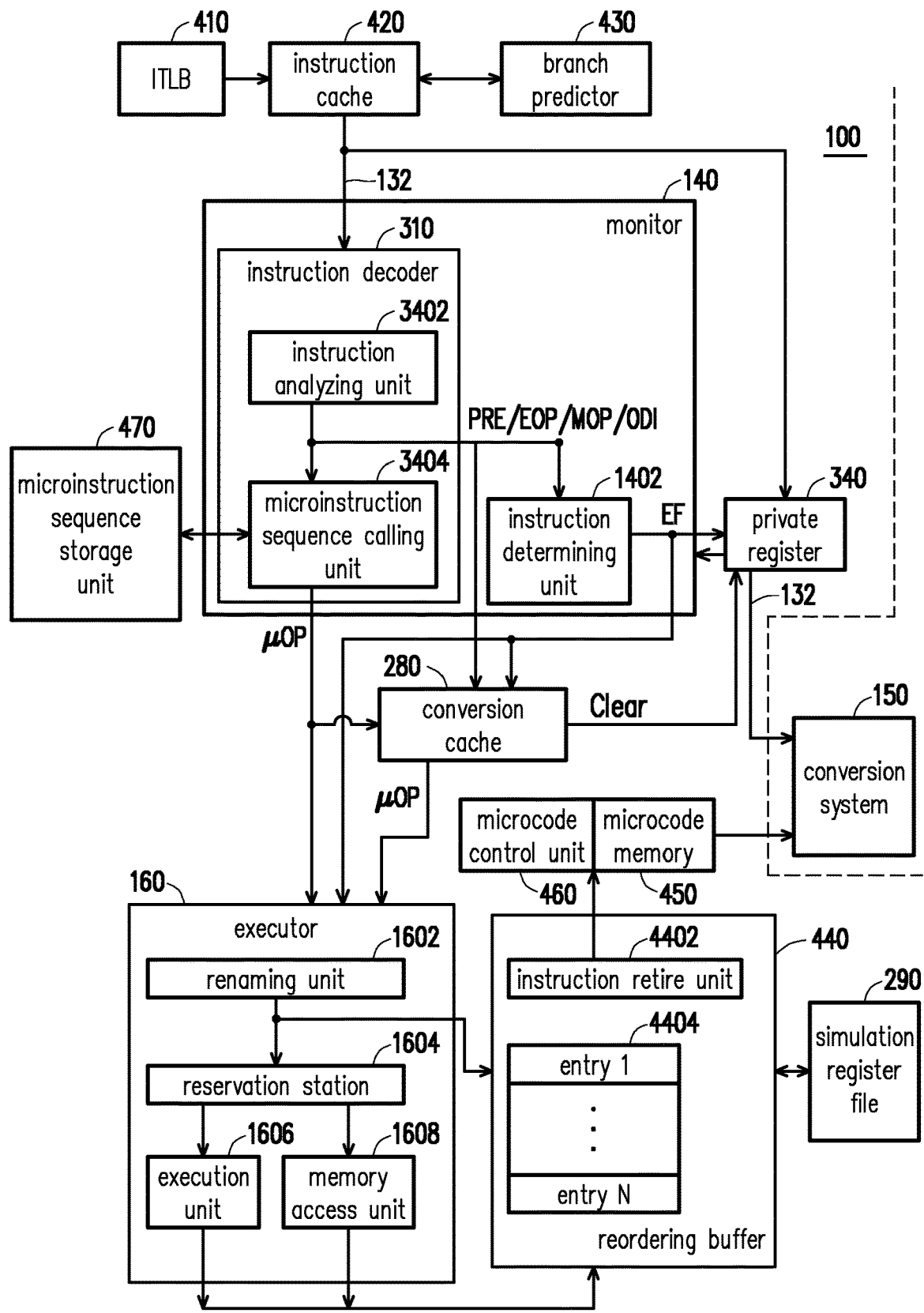
FIG. 4B is a structural view of the processor according to yet another embodiment of the disclosure.

FIG. 4B is a structural view of a processor according to yet another embodiment of the disclosure. In FIG. 4B, the components/modules with the same reference numerals as those in FIG. 4A have the same functions as that in FIG. 4A, so the descriptions of their functions is not repeated herein. In comparison with FIG. 4A, the monitor 140B in FIG. 4B applies the architecture of the monitor 140 in FIG. 4A and forwards the emulation flag EF accompanied with the microinstruction (e.g., the no operation instruction) to the renaming unit 1602, so the renaming unit 1602 and the microinstruction buffer 4404 respectively need one more bit to store the emulation flag EF (in actual implementations, it may be unnecessary to add an additional bit in hardware if there is a reserved bit within the renaming unit 1602 capable of storing the emulation flag EF). Accordingly, the instruction retire unit 4402 may directly check the emulation flag EF accompanied with the microinstruction without checking the EF within private registers 340 when retiring the microinstruction. In addition, when the emulation flag EF is asserted, the conversion cache 280 stores the microinstruction sequence sent from the microinstruction sequence calling unit 3404 and serves as a reference for the same extended instruction subsequently. Therefore, when the converted instruction sequence corresponding to the ready-for-execution instruction 132 has been stored in the conversion cache 280, a clear signal is sent to the private registers 340 to clear the emulation flag EF and the format information (or the ready-for-execution instruction 132 stored therein) after the corresponding converted instruction sequence is accessed, which means that the current converted instruction sequence has been obtained and there is no need to invoke the conversion system 150 for instruction conversions. Additionally, if the converted instruction sequence corresponding to the ready-for-execution instruction 132 is not stored in the conversion cache 280, the conversion system 150 is called to convert the ready-for-execution instruction 132. Meanwhile, when the converted instruction sequence is sent from the conversion system 150 to the processor 110, this converted instruction sequence may be loaded into the instruction cache 420 of the processor 110 by means of a jump or a call operation, the emulation flag EF and format information (or the ready-for-execution instruction 132) in the private registers 340 are then cleared, and the conversion process for the ready-for-execution instruction is finished. In one embodiment, as mentioned above, the processor 110 may be specifically designed to include specific pins or to employ the mechanisms provided by those model specific registers, so that the converted instruction sequence (composed of microinstructions) converted by the conversion system 150 may be directly fed into the processor 110 through the specific pins or the model specific registers of the processor 110, directly sent to the conversion cache 280 for storing, and finally sent to the pipeline circuitry for executions.

Figure 4C:
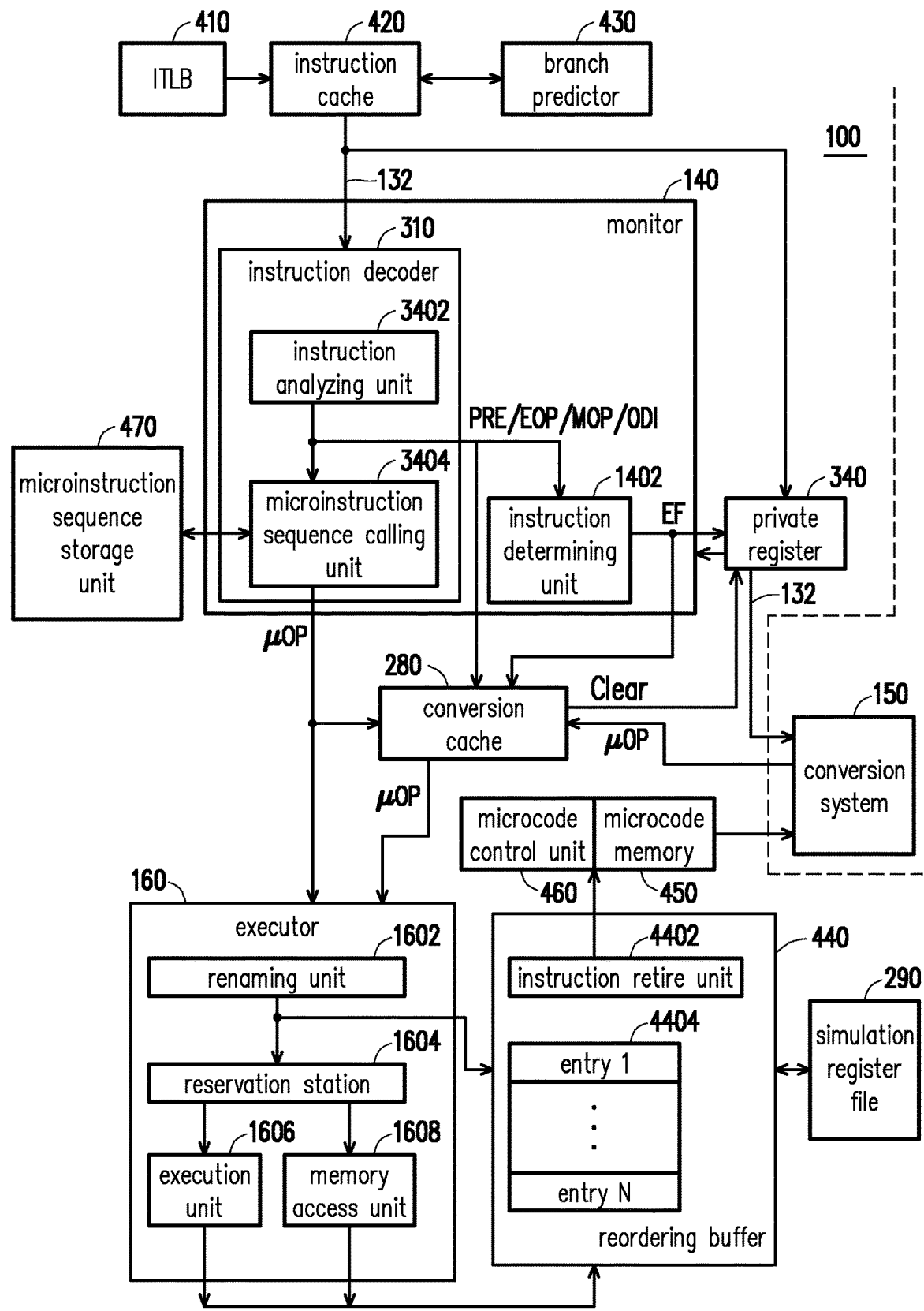
FIG. 4C is a structural view of the processor according to still another embodiment of the disclosure.

FIG. 4C is a structural view of a processor according to still another embodiment of the disclosure. In FIG. 4C, the components/modules with the same reference numerals as those in FIGS. 4A and 4B have the same functions as that in FIG. 4A and FIG. 4B, so the descriptions of their functions is not repeated herein. Compared to FIGS. 4A and 4B, the converted instruction sequence directed from the conversion system 150 of FIG. 4C is composed of microinstructions supported by the processor 110, which may be directly fed into the conversion cache 280 and then sent to the pipeline circuitry for executions bypassing the instruction decoding operations. The monitor 140C adopts the architecture of the monitor 140 of FIG. 4A and the emulation flag EF along with the microinstruction are sent to the renaming unit 1602, so the renaming unit 1602 and the microinstruction buffer 4404 respectively need one more bit to store the emulation flag EF (in actual implementations, it may be unnecessary to add a new bit in hardware if there is a reserved bit within the renaming unit 1602 capable of storing the emulation flag EF). Accordingly, the instruction retire unit 4402 may directly check the emulation flag EF accompanying the microinstruction without checking in the private registers 340 when retiring the microinstruction. In addition, when the emulation flag EF is asserted, the conversion cache 280 also stores the microinstruction sequence sent from the microinstruction sequence calling unit 3404 and also serves as a reference for the same extended instruction subsequently. Therefore, when the converted instruction sequence corresponding to the ready-for-execution instruction 132 has been stored in the conversion cache 280, after the corresponding converted instruction sequence is sent, a clear signal is sent to the private registers 340 to clear the emulation flag EF and the format information (or the ready-for-execution instruction 132 stored therein), which means that the current converted instruction sequence has been accessed, and there is no need to call the conversion system 150 for conversion operations. Moreover, if the converted instruction sequence corresponding to the ready-for-execution instruction 132 is not stored in the conversion cache 280, the conversion system 150 is called to convert the ready-for-execution instruction 132. Meanwhile, when the converted instruction sequence is sent from the conversion system 150 to the processor 110, which is loaded into the instruction cache 420 of the processor 110 through a jump or a call operation, and subsequently the emulation flag EF and format information (or the ready-for-execution instruction 132) in the private registers 340 are cleared.

Please note the private registers 340 of FIGS. 4A-4C may be incorporated into the monitor 140, the monitor 140B, and the monitor 140C; in another embodiment, the conversion cache 280 may be integrated with the private registers 340; and in yet another embodiment, the conversion cache 280 may be incorporated into the monitor 140, the monitor 140B, and the monitor 140C, all of which are not limited in the disclosure.

Figure 5:
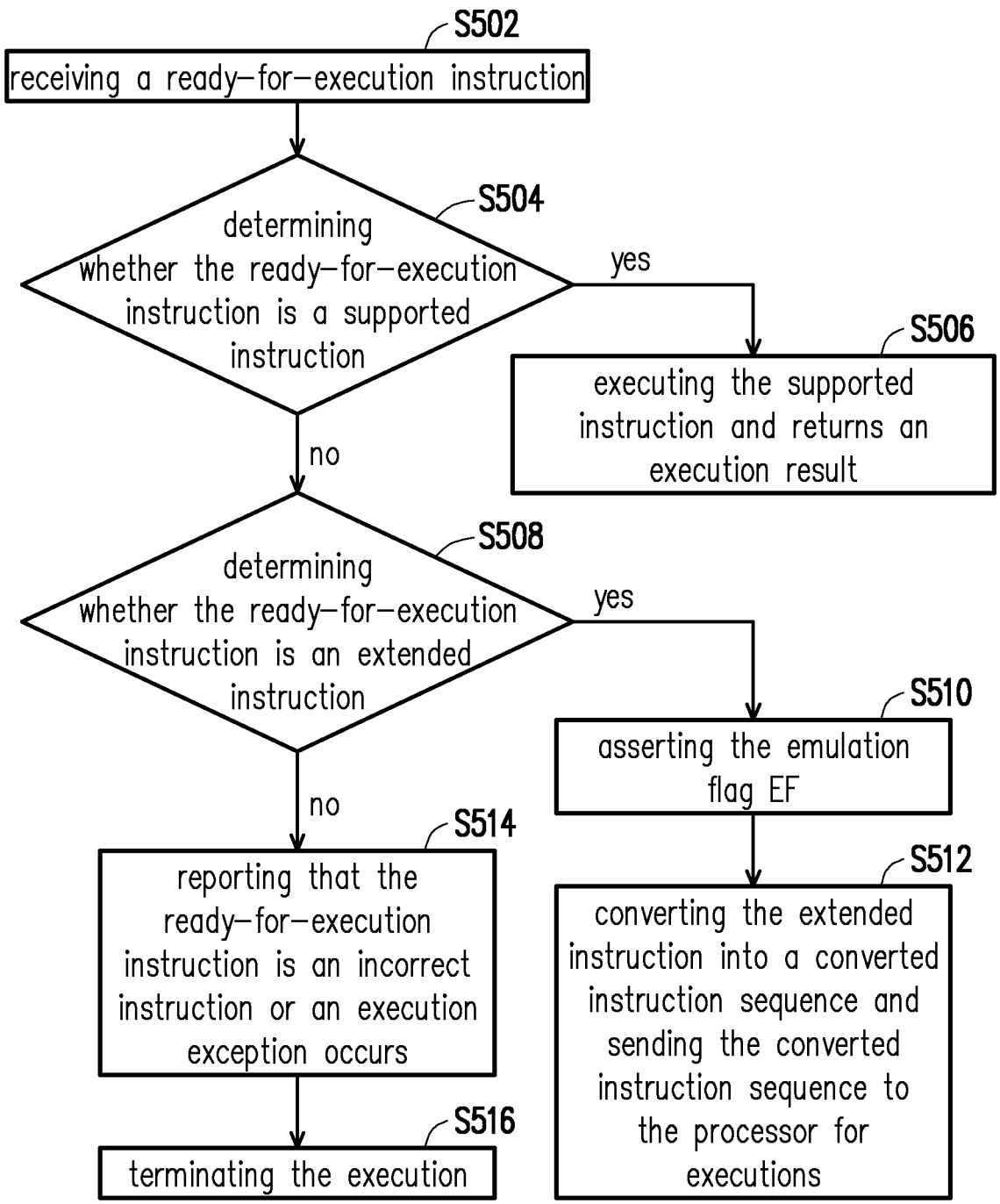
FIG. 5 is a flowchart illustrating an instruction conversion method according to an embodiment of the disclosure.

FIG. 5 is a flowchart illustrating an instruction conversion method according to an embodiment of the disclosure. The instruction conversion method is adapted for the conversion device in the electronic device 100 in the foregoing embodiments. Referring to both FIG. 1 and FIG. 5, in step S502, the processor 110 receives a ready-for-execution instruction 132 from the application program 130. In step S504, the processor 110 determines whether the ready-for-execution instruction 132 is a supported instruction (e.g., a native instruction). If the ready-for-execution instruction 132 is a supported instruction (e.g., the determination result in step S504 is "yes"), the flow proceeds to step S506 and the executor 160 (as shown in FIG. 1) executes this supported instruction and returns an execution result to the application program 130 (along the arrow 173 in FIG. 1). If the ready-for-execution instruction 132 is not a supported instruction (e.g., the determination result in step S504 is "no"), then the flow proceeds to step S508. The processor 110 determines whether the ready-for-execution instruction 132 is an extended instruction (i.e., an instruction under a new instruction set or an extended instruction set). If the ready-for-execution instruction 132 is an extended instruction (e.g., the determination result in step S508 is "yes"), then the flow proceeds to step S510, wherein the monitor 140 (as shown in FIG. 1) asserts the emulation flag EF (e.g., the emulation flag EF is set to "1"). Next, the flow proceeds to step S512, and the conversion system 150 (as shown in FIG. 1) converts the ready-for-execution instruction 132 (currently the extended instruction) into a converted instruction sequence and sends this converted instruction sequence to the processor 110 for executions (along the arrow 175 in FIG. 1), and the processor 110 returns an execution result to the application program 130 (along the arrow 173 in FIG. 1). The flow proceeds to step S514 if the ready-for-execution instruction 132 is determined not an extended instruction (e.g., "no") in step S508. The processor 110 reports that the ready-for-execution instruction 132 is an incorrect instruction or an execution exception occurs, and then the executions of the ready-for-execution instruction 132 is terminated, as shown in step S516.

Figure 6:
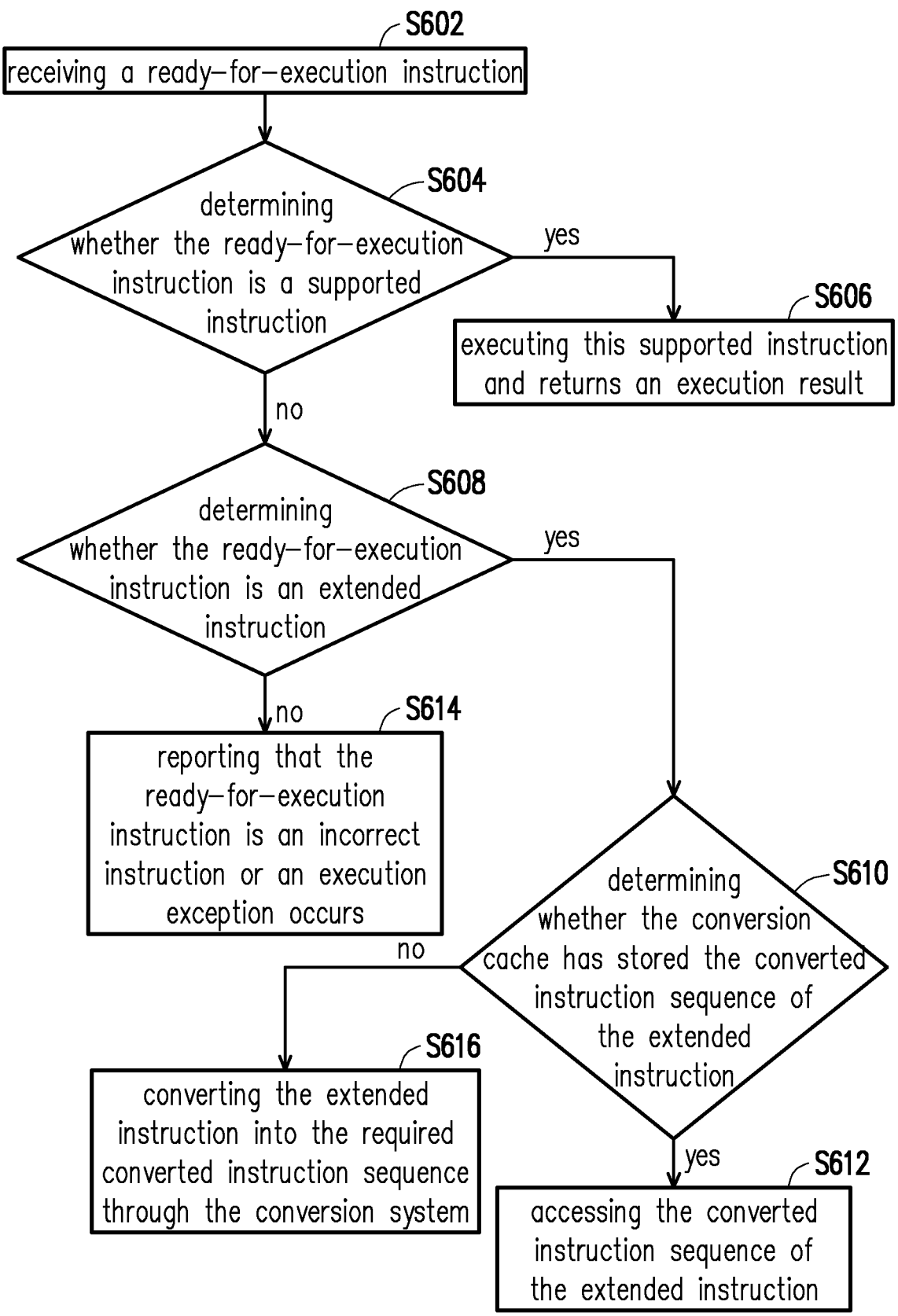
FIG. 6 is a flowchart illustrating an instruction conversion method according to another embodiment of the disclosure.

FIG. 6 is a flowchart illustrating an instruction conversion method according to another embodiment of the disclosure. The instruction conversion method is adapted for the conversion device in the electronic device 200 in the foregoing embodiments. Referring to both FIG. 2A and FIG. 6, in step S602, the processor 110 receives a ready-for-execution instruction 132 from the application program 130. In step S604, the processor 110 determines whether the ready-for-execution instruction 132 is a supported instruction (e.g., a native instruction). If the ready-for-execution instruction 132 is a supported instruction, the flow proceeds to step S606, wherein the executor 160 (as shown in FIG. 2A) executes this supported instruction and returns an execution result to the application program 130 (along the arrow 173 in FIG. 2A). If the ready-for-execution instruction 132 is not a supported instruction, the flow proceeds to step S608 and then the processor 110 determines whether the ready-for-execution instruction 132 is an extended instruction (i.e., an instruction under a new instruction set or an extended instruction set). If the ready-for-execution instruction 132 is not an extended instruction (e.g., the determination result in step S608 is "no"), the flow proceeds to step S614. The processor reports that the ready-for-execution instruction 132 is an incorrect instruction or an execution exception occurs, and then the executions of the ready-for-execution instruction 132 is terminated. If the ready-for-execution instruction 132 is determined as an extended instruction in step S608, the flow proceeds to step S610 to further determine whether the conversion cache 280 (as shown in FIG. 2A) has stored the converted instruction sequence of the extended instruction therein. If the conversion cache 280 has stored the converted instruction sequence of the extended instruction (e.g., the determination is "yes" in step S608), the flow proceeds to steps S612 to access the converted instruction sequence of the extended instruction, which is then integrated with the operand information of the current ready-for-execution instruction 132. Next, the emulation flag EF is clear and the converted instruction sequence is forwarded to the pipeline circuitry of the processor 110 for executions. Finally, the execution result is returned to the application program 130 (along the arrow 173 in FIG. 2A). If the converted instruction sequence of the extended instruction is not stored in the conversion cache 280 (e.g., the determination is "no" in step S610), then the flow proceeds to step S616. The extended instruction is converted into the required converted instruction sequence through the conversion system 150 (as shown in FIG. 2A) and this converted instruction sequence is directed to the processor 110 for executions (along the arrow 175 in FIG. 2A). Associated execution result is returned to the application program 130 (along the arrow 173 in FIG. 2A), wherein the converted instruction sequence is reserved into the conversion cache 280.

Based on the above, the instruction conversion device and the instruction conversion method in the embodiments of the disclosure adopt a monitor to determine whether a ready-for-execution instruction derived from an application program is a supported instruction or an extended instruction. Moreover, when the ready-for-execution instruction is determined as an extended instruction, the conversion system provided in the embodiments of the disclosure converts the ready-for-execution instruction into a converted instruction sequence that the processor is capable of executing, and sends this converted instruction sequence to the processor for executions. Additionally, in the embodiments of the disclosure, the converted instruction sequence corresponding to the extended instruction may be stored into a conversion cache, and the stored corresponding converted instruction sequence is integrated with the operand information of the subsequent ready-for-execution instruction when the same extended instruction is found. The integrated converted instruction sequence is then forwarded to the pipeline circuitry for executions, and thereby preventing the conversion system from performing repetitive conversion operations. Therefore, in the embodiments of the disclosure, a processor with an older version of instruction set is adopted to convert and simulate an extended instruction under a new instruction set or an extended instruction set, thereby prolonging the lifespan of the electronic device.

The embodiments are only favorable embodiments of the disclosure, and they are not intended to limit the scope of the disclosure. It will be apparent to one of ordinary skill in the art that modifications to the described embodiments may be made without departing from the spirit of the invention. Accordingly, the scope of the disclosure is defined by the attached claims not by the above detailed descriptions.

What is claimed is:

1. An instruction conversion device, comprising:
a monitor adapted to determine whether a ready-for-execution instruction is a supported instruction or an extended instruction,
wherein, the ready-for-execution instruction is executed through a processor if the ready-for-execution instruction is the supported instruction; and
in response to that the ready-for-execution instruction is the extended instruction:
an emulation flag is asserted by the monitor and a microinstruction corresponding to the extended instruction is generated by the processor; and
in response to that the emulation flag is asserted by the monitor and the microinstruction corresponding to the extended instruction is retired by the processor, a conversion system is triggered to convert the ready-for-execution instruction into a converted instruction sequence, and the converted instruction sequence is sent to the processor for executions.

2. The instruction conversion device according to claim 1, wherein the processor comprises:
an executor coupled to the monitor,
wherein the processor uses the executor to execute the ready-for-execution instruction when the ready-for-execution instruction is the supported instruction, and
the processor uses the executor to execute the ready-for-execution instruction according to the converted instruction sequence of the extended instruction when the ready-for-execution instruction is the extended instruction.

3. The instruction conversion device according to claim 1, wherein the processor comprises a conversion cache, the processor stores the converted instruction sequence of the extended instruction into the conversion cache, and
the ready-for-execution instruction is executed according to the converted instruction sequence stored in the conversion cache if the ready-for-execution instruction is the extended instruction and the converted instruction sequence has been stored.

4. The instruction conversion device according to claim 3, wherein if the converted instruction sequence of the extended instruction is not stored in the processor, the monitor sends the extended instruction to the conversion system which converts the extended instruction to obtain the converted instruction sequence, and the ready-for-execution instruction is executed through the processor if the converted instruction sequence is stored in the processor.

5. The instruction conversion device according to claim 3, wherein an executor in the processor directly executes the converted instruction sequence when the processor has stored the converted instruction sequence of the extended instruction.

6. The instruction conversion device according to claim 3, wherein the emulation flag is disposed in the processor when the processor does not store the converted instruction sequence of the extended instruction; and when the emulation flag is asserted, the extended instruction is converted to the converted instruction sequence by the conversion system, and then the converted instruction sequence is stored into the processor, and the processor executes the ready-for-execution instruction through executing the converted instruction sequence.

7. The instruction conversion device according to claim 1, wherein the conversion system comprises:
an exception processing module,
wherein the exception processing module generates an exception and notifies an application program of the exception when the conversion system converts a unconvertible instruction and an abnormality or an exception occurs.

8. The instruction conversion device according to claim 1, wherein the monitor determines whether the ready-for-execution instruction is the supported instruction or the extended instruction according to a prefix, an escape code, and an opcode.

9. The instruction conversion device according to claim 1, wherein the supported instruction and the extended instruction are a same type of instruction.

10. The instruction conversion device according to claim 9, wherein the supported instruction and the extended instruction are both instructions compatible to Complex Instruction Set Computing (CISC) processors, instructions compatible to Reduced Instruction Set Computing (RISC) processors, instructions compatible to Microprocessor without Interlocked Pipeline Stages (MIPS) processors, or instructions compatible to Reduced Instruction Set Computing-five (RISC-V) processors.

11. The instruction conversion device according to claim 1, wherein the converted instruction sequence consists of microinstructions, and the converted instruction sequence is directly sent to the processor for executions without being decoded through an instruction decoder.

12. The instruction conversion device according to claim 1, wherein the microinstruction corresponding to the extended instruction includes a no operation instruction, and after the no operation instruction is retired, the conversion system is requested to generate the converted instruction sequence for the extended instruction.

13. The instruction conversion device according to claim 1, wherein the conversion system is stored in a basic input/output system, and is loaded into an operating system when a system embodied with the processor is turned on.

14. The instruction conversion device according to claim 1, wherein the converted instruction sequence of the extended instruction is directly fed to the processor by the conversion system through at least one pin of the processor, or the converted instruction sequence of the extended instruction is directed to the processor by reading and writing a model specific register.

15. An instruction conversion method, comprising:
determining whether a ready-for-execution instruction is a supported instruction or an extended instruction;
executing the ready-for-execution instruction through a processor if the ready-for-execution instruction is the supported instruction; and
in response to that the ready-for-execution instruction is the extended instruction:
using a monitor to assert an emulation flag and using the processor to generate a microinstruction corresponding to the extended instruction; and
in response to that the emulation flag is asserted by the monitor and the microinstruction corresponding to the extended instruction is retired by the processor, triggering a conversion system to convert the ready-for-execution instruction into a converted instruction sequence, and sending the converted instruction sequence to the processor for executions.

16. The instruction conversion method according to claim 15, wherein the processor comprises:
an executor coupled to the monitor,
wherein the processor uses the executor to execute the ready-for-execution instruction when the monitor determines that the ready-for-execution instruction is the supported instruction, and
wherein the processor uses the executor to execute the ready-for-execution instruction according to the converted instruction sequence of the extended instruction when the monitor determines that the ready-for-execution instruction is the extended instruction.

17. The instruction conversion method according to claim 15, further comprising:
storing the converted instruction sequence of the extended instruction through the processor;
executing the ready-for-execution instruction according to the stored converted instruction sequence if the ready-for-execution instruction is the extended instruction and the converted instruction sequence has been stored.

18. The instruction conversion method according to claim 17, further comprising:
sending the extended instruction to the conversion system to convert the extended instruction to obtain the converted instruction sequence if the converted instruction sequence has not been stored;
storing the converted instruction sequence; and
executing the ready-for-execution instruction through the processor.

19. The instruction conversion method according to claim 17, further comprising:
directly executing the converted instruction sequence through the processor when the converted instruction sequence of the extended instruction has been stored.

20. The instruction conversion method according to claim 17, further comprising:
obtaining the converted instruction sequence by converting the extended instruction through the conversion system;
storing the converted instruction sequence into the processor; and
executing the ready-for-execution instruction through the processor when the converted instruction sequence has not been stored.

21. The instruction conversion method according to claim 15, further comprising:
generating an exception through an exception processing module, and notifying an application program of the exception when the conversion system converts an unconvertible instruction and an abnormality or an exception occurs.

22. The instruction conversion method according to claim 15, wherein the step of determining whether the ready-for-execution instruction is the supported instruction or the extended instruction comprises:
determining whether the ready-for-execution instruction is the supported instruction or the extended instruction according to a prefix, an escape code, and an opcode.

23. The instruction conversion method according to claim 15, wherein the supported instruction and the extended instruction are a same type of instruction.

24. The instruction conversion method according to claim 15, wherein the converted instruction sequence is a type of binary codes, and the converted instruction sequence that is generated after converting is directly provided to the processor for executions without being decoded through an instruction decoder.

25. The instruction conversion method according to claim 15, wherein the microinstruction corresponding to the extended instruction includes a no operation instruction, and the instruction conversion method further comprising:
requesting the conversion system to generate the converted instruction sequence for the extended instruction after retiring the no operation instruction.

26. The instruction conversion method according to claim 15, wherein the conversion system is stored in a basic input/output system, and is loaded into an operating system when a system comprising the processor is turned on.

27. The instruction conversion method according to claim 15, wherein the converted instruction sequence of the extended instruction is fed to the processor by the conversion system through at least one pin of the processor, or the converted instruction sequence of the extended instruction is directed to the processor by reading and writing a model specific register.

* * * * *